(12) United States Patent
Im et al.

(10) Patent No.: US 10,211,418 B2
(45) Date of Patent: Feb. 19, 2019

(54) LIGHT EMITTING DEVICE AND FABRICATING METHOD THEREOF

(71) Applicant: SAMSUNG DISPLAY CO., LTD., Yongin-si, Gyeonggi-do (KR)

(72) Inventors: Hyun Deok Im, Yongin-si (KR); Jong Hyuk Kang, Yongin-si (KR); Dae Hyun Kim, Yongin-si (KR); Joo Yeol Lee, Yongin-si (KR); Chi O Cho, Yongin-si (KR); Hyun Min Cho, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/650,083

(22) Filed: Jul. 14, 2017

(65) Prior Publication Data
US 2018/0019426 A1    Jan. 18, 2018

(30) Foreign Application Priority Data

Jul. 15, 2016 (KR) .................. 10-2016-0090207

(51) Int. Cl.
| | |
|---|---|
| *H01L 29/06* | (2006.01) |
| *H01L 51/50* | (2006.01) |
| *H01L 51/05* | (2006.01) |
| *H01L 51/52* | (2006.01) |
| *H01L 25/075* | (2006.01) |
| *H01L 27/32* | (2006.01) |
| *H01L 33/62* | (2010.01) |
| *F21Y 107/00* | (2016.01) |

(52) U.S. Cl.
CPC ........ *H01L 51/502* (2013.01); *H01L 25/0753* (2013.01); *H01L 25/0756* (2013.01); *H01L 51/0512* (2013.01); *H01L 51/5296* (2013.01); *F21Y 2107/00* (2016.08); *H01L 27/32* (2013.01); *H01L 33/62* (2013.01); *H01L 51/5203* (2013.01); *H01L 51/5271* (2013.01); *H01L 2933/0033* (2013.01)

(58) Field of Classification Search
CPC ............... H01L 51/502; H01L 51/0014; H01L 51/0512; H01L 51/5296; H01L 51/5203; H01L 51/5271; H01L 25/0753; H01L 25/0756
USPC ............................................................ 257/13
See application file for complete search history.

(56) References Cited

U.S. PATENT DOCUMENTS

| | | |
|---|---|---|
| 9,287,242 B2 | 3/2016 | Shibata et al. |
| 2013/0027623 A1* | 1/2013 | Negishi ............... H01L 25/0753 349/42 |
| 2016/0148911 A1 | 5/2016 | Do |

FOREIGN PATENT DOCUMENTS

| | | |
|---|---|---|
| KR | 10-2007-0035306 A | 3/2007 |
| KR | 10-1490758 B1 | 2/2015 |
| KR | 10-1628345 B1 | 6/2016 |

* cited by examiner

*Primary Examiner* — Tu-Tu V Ho
(74) *Attorney, Agent, or Firm* — Lee & Morse, P.C.

(57) ABSTRACT

A light emitting device includes a plurality of unit light emitting regions on a substrate. At least one of the unit light emitting regions includes at least one pair of first and second electrodes that are spaced apart, at least one first bar-type LED in a first layer on the substrate, and at least one second bar-type LED in a second layer on the substrate. At least one of the first bar-type LED or the second bar-type LED is electrically connected between the first electrode and the second electrode.

22 Claims, 21 Drawing Sheets

LIGHT EMITTING DEVICE AND FABRICATING METHOD THEREOF

CROSS-REFERENCE TO RELATED APPLICATION

Korean Patent Application No. 10-2016-0090207, filed on Jul. 15, 2016, and entitled, "Light Emitting Device and Fabricating Method Thereof," is incorporated by reference herein in its entirety.

BACKGROUND

1. Field

One or more embodiments described herein relate to a light emitting device and a method for fabricating a light emitting device.

2. Description of the Related Art

Light emitting diodes (LEDs) exhibit relatively satisfactory durability, even in poor environmental conditions, and have excellent performance in terms of lifespan and luminance. One technique for fabricating a micro-bar-type LED on a micro or nano scale involves forming an inorganic crystal structure. This technique involves growing a nitride-based semiconductor. The small size of bar-type LEDs make then suitable for use in pixels of a self-luminescent display panel.

SUMMARY

In accordance with one or more embodiments, a light emitting device includes a plurality of unit light emitting regions on a substrate, wherein at least one of the unit light emitting regions includes: at least one pair of first and second electrodes that are spaced apart; at least one first bar-type LED in a first layer on the substrate; and at least one second bar-type LED in a second layer on the substrate, wherein at least one of the first bar-type LED or the second bar-type LED is electrically connected between the first electrode and the second electrode.

The first bar-type LED and the second bar-type LED may emit light of different colors, and one of the first and second bar-type LEDs having a longer wavelength than the other bar-type LED may be closer to the substrate. At least one end of at least one of the first bar-type LED or the second bar-type LED may be an electrically floated end.

The unit light emitting regions include a first unit light emitting region in which the first bar-type LED is electrically connected between the first electrode and the second electrode; and a second unit light emitting region in which the second bar-type LED is electrically connected between the first electrode and the second electrode.

At least one of the unit light emitting regions may include at least one third bar-type LED in a third layer on the substrate. The unit light emitting regions include a first unit light emitting region in which the first bar-type LED is electrically connected between the first electrode and the second electrode, the first unit light emitting region emitting light of a first color; a second unit light emitting region in which the second bar-type LED is electrically connected between the first electrode and the second electrode, the second unit light emitting region emitting light of a second color; and a third unit light emitting region in which the third bar-type LED is electrically connected between the first electrode and the second electrode, the third unit light emitting region emitting light of a third color.

First ends of the first bar-type LED, the second bar-type LED, and the third bar-type LED may be commonly connected to the first electrode, and second ends of the first bar-type LED, the second bar-type LED, and the third bar-type LED may be commonly connected to the second electrode.

The light emitting device may include a first insulating layer between the first bar-type LED and the second bar-type LED; a second insulating layer between the second bar-type LED and the third bar-type LED; and a third insulating layer on the third bar-type LED. At least one of the first bar-type LED, the second bar-type LED, or the third bar-type LED may be aligned such that a first end of at least one of the first bar-type LED, the second bar-type LED, or the third bar-type LED overlaps the first electrode and a second end of at least one of the first bar-type LED, the second bar-type LED, or the third bar-type LED overlaps the second electrode.

At least one of the unit light emitting regions may include a first contact electrode penetrating the first insulating layer, the second insulating layer, and the third insulating layer, the first contact electrode electrically connecting, to the first electrode, one end of at least one of the first bar-type LED, the second bar-type LED, or the third bar-type LED; and a second contact electrode penetrating the first insulating layer, the second insulating layer, and the third insulating layer, the second contact electrode electrically connecting, to the second electrode, the other end of at least one of the first bar-type LED, the second bar-type LED, or the third bar-type LED.

The first electrode may be electrically connected to a first end of the first bar-type LED, and the second electrode is electrically connected to a second end of the first bar-type LED, and at least one of the unit light emitting regions includes a third electrode electrically connected to a first end of the second bar-type LED and a fourth electrode electrically connected to a second end of the second bar-type LED.

In accordance with one or more other embodiments, a method for fabricating a light emitting device includes forming at least one pair of first and second electrodes in each of unit light emitting regions on a substrate; injecting at least one first bar-type LED into the unit light emitting regions; forming a first insulating layer over the first bar-type LED; injecting at least one second bar-type LED onto the first insulating layer; forming a second insulating layer over the second bar-type LED; and forming a first contact electrode such that the first electrode is electrically connected to a first end of at least one of the first bar-type LED and the second bar-type LED, and forming a second contact electrode such that the second electrode is electrically connected to a second end of the bar-type LED at least connected to the first contact electrode.

The unit light emitting regions may include a first unit light emitting region and a second unit light emitting region, and the method may include after the first bar-type LED is injected, aligning the first bar-type LED between the first and second electrodes of the first unit light emitting region; and after the second bar-type LED is injected, aligning the second bar-type LED between the first and second electrodes of the second unit light emitting region. Aligning the first bar-type LED may include applying a first voltage between the first and second electrodes of the first unit light emitting region, and aligning the second bar-type LED may include applying a second voltage greater than the first voltage between first and second electrodes of second unit light emitting region.

The method may include aligning at least one of the first or second bar-type LEDs such that ends of at least one of the first or second bar-type LEDs are on the first and second electrodes, respectively. Forming the first and second contact electrodes may include forming a first contact hole penetrating the first and second insulating layers to expose a first end of at least one of the first or second bar-type LEDs and at least one region of the first electrode and a second contact hole penetrating the first and second insulating layers to expose a second end of at least one of the first or second bar-type LEDs and at least one region of the second electrode; forming a first contact electrode to be buried in the first contact hole, and forming a second contact electrode to be buried in the second contact hole.

The method may include, after the first bar-type LED is injected, aligning the first bar-type LED such that ends of the first bar-type LED are on the first and second electrodes, respectively; and after the second bar-type LED is injected, aligning the second bar-type LED such that ends of the second bar-type LED are on the first and second electrodes, respectively.

Forming the first and second contact electrodes may include forming a first contact hole penetrating the first and second insulating layers to expose at least one region of the first electrode and first ends of the first and second bar-type LEDs and a second contact hole penetrating the first and second insulating layers to expose at least one region of the second electrode and second ends of the first and second bar-type LEDs; and forming, in the first contact hole, a first contact electrode commonly connecting the first electrode to first ends of the first and second bar-type LEDs, and forming, in the second contact hole, a second contact electrode commonly connecting the second electrode to second ends of the first and second bar-type LEDs.

The method may include injecting at least one third bar-type LED onto the second insulating layer; and forming a third insulating layer over the third bar-type LED. The method may include, after the first bar-type LED is injected, aligning the first bar-type LED to be electrically connected between the first and second electrodes, wherein forming the first and second contact electrodes includes: forming a conductive layer on the second bar-type LED; and patterning the conductive layer to form a third electrode connected to one end of the second bar-type LED and a fourth electrode connected to the other end of the second bar-type LED.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
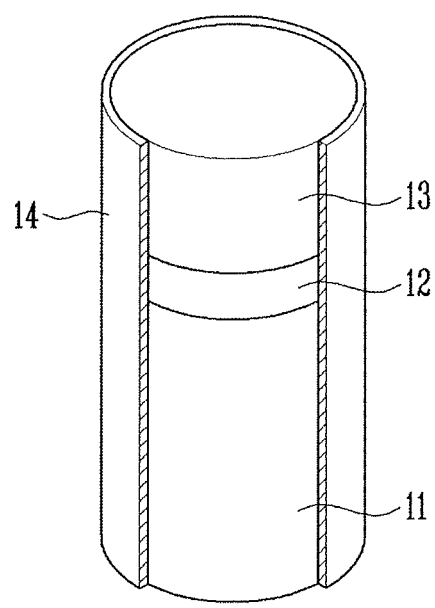
FIG. 1 illustrates an embodiment of a bar-type LED.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. In the entire specification, when an element is referred to as being "connected" or "coupled" to another element, it can be directly connected or coupled to the another element or be indirectly connected or coupled to the another element with one or more intervening elements interposed therebetween.

FIG. 1 illustrates an embodiment of a bar-type LED which includes an active layer 12 between first and second conductive semiconductor layers 11 and 13. The bar-type LED may have, for example, as a stack structure in which the first conductive semiconductor layer 11, the active layer 12, and the second conductive semiconductor layer 13 are sequentially stacked.

In some embodiments, the bar-type LED may further include an insulating film 14 and/or first and second electrodes. The first electrode may be electrically connected to the first conductive semiconductor layer 11. The second electrode may be electrically connected to the second conductive semiconductor layer 13. For example, the first electrode may be electrically connected to the bar-type LED through one surface of the first conductive semiconductor layer 11 (e.g., in FIG. 1, a lower surface of the bar-type LED) which is not covered by the insulating film 14. The second electrode may be electrically connected to the bar-type LED through one surface of the second conductive semiconductor layer 13 (e.g., in FIG. 1, an upper surface of the bar-type LED), which is not covered by the insulating film 14.

In some embodiments, a conductive contact layer may be further provided between the first electrode and the first conductive semiconductor layer 11 and/or between the second electrode and the second conductive semiconductor layer 13. In addition, in some embodiments, the insulating film 14 may allow at least one region of a side surface of the first conductive semiconductor layer 11 and/or a side surface of the second conductive semiconductor layer 13 to be exposed. In the embodiment, the type and/or position of the insulating film 14 may be different in another embodiment.

The bar-type LED in FIG. 1 has a cylindrical shape. In another embodiment, the bar-type LED may have various polygonal column shapes including a rectangular parallelepiped shape, or another shape. For example, the bar-type LED may have a rod or bar shape which is longer in a length direction than a width direction (e.g., an aspect ratio greater than 1). Thus, the length of the bar-type LED may be greater than its diameter or width. The size of the diameter and/or length of the bar-type LED may be, for example, in the micro or nano scale. These sizes may be in a different size scale in another embodiment.

The first conductive semiconductor layer 11 may include, for example, at least one n-type semiconductor layer. For example, the first conductive semiconductor layer 11 may include at least one of InAlGaN, GaN, AlGaN, InGaN, AlN, or InN. The first conductive semiconductor layer 11 may include a semiconductor layer doped with a first conductive dopant, e.g., Si, Ge, or Sn. The material of the first conductive semiconductor layer 11 may be different in another embodiment.

The active layer 12 is on the first conductive semiconductor layer 11 and may be formed in a single or multiple quantum well structure. In some embodiments, a clad layer doped with a conductive dopant may be formed over and/or under the active layer 12. For example, the clad layer may be an AlGaN layer or InAlGaN layer. In embodiment, the active layer 12 may include AlGaN or AlInGaN. When an electric field having a predetermined voltage or more is applied to ends of the bar-type LED, the bar-type LED emits light based on a recombination of electron-hole pairs in active layer 12.

The second conductive semiconductor layer 13 is on the active layer 12 and may include a semiconductor layer different from the first conductive semiconductor layer 11. For example, the second conductive semiconductor layer 13 may include at least one p-type semiconductor layer. The second conductive semiconductor layer 13 may include, for example, at least one of InAlGaN, GaN, AlGaN, InGaN, AlN, or InN. The second conductive semiconductor layer 13 may include a semiconductor layer doped with a second conductive dopant, e.g., Mg. The material of second conductive semiconductor layer 13 may be different in another embodiment.

In some embodiments, the bar-type LED may further include a phosphor layer, an active layer, a semiconductor layer, and/or an electrode layer, which are over and/or under each of the first conductive semiconductor layer 11, the active layer 12, and the second conductive semiconductor layer 13. Also, the bar-type LED may include insulating film 14. In some embodiments, the insulating film 14 may be omitted.

The insulating film 14 surrounds at least one portion of outer circumferential surfaces of the first conductive semiconductor layer 11, the active layer 12, and/or the second conductive semiconductor layer 13. For example, the insulating film 14 may surround the outer circumferential surface of the active layer 12. In some embodiments, the insulating film 14 may include a transparent insulating material. For example, the insulating film 14 may include at least one of $SiO_2$, $Si_3N_4$, $Al_2O_3$, or $TiO_2$.

The insulating film 14 may prevent a short circuit between the active layer 12 and the first electrode and/or the second electrode. Formation of the insulating film 14 may also reduce or minimize surface defects of the bar-type LED, which may improve lifespan and efficiency. In one embodiment, a plurality of bar-type LEDs may be formed and densely arranged. In this case, the insulating film 14 may prevent an undesired short circuit between the bar-type LEDs.

The bar-type LED of the embodiments described herein may be used as a light emitting source for various lighting devices, self-luminescent display panels, or other electronic devices.

Figure 2:
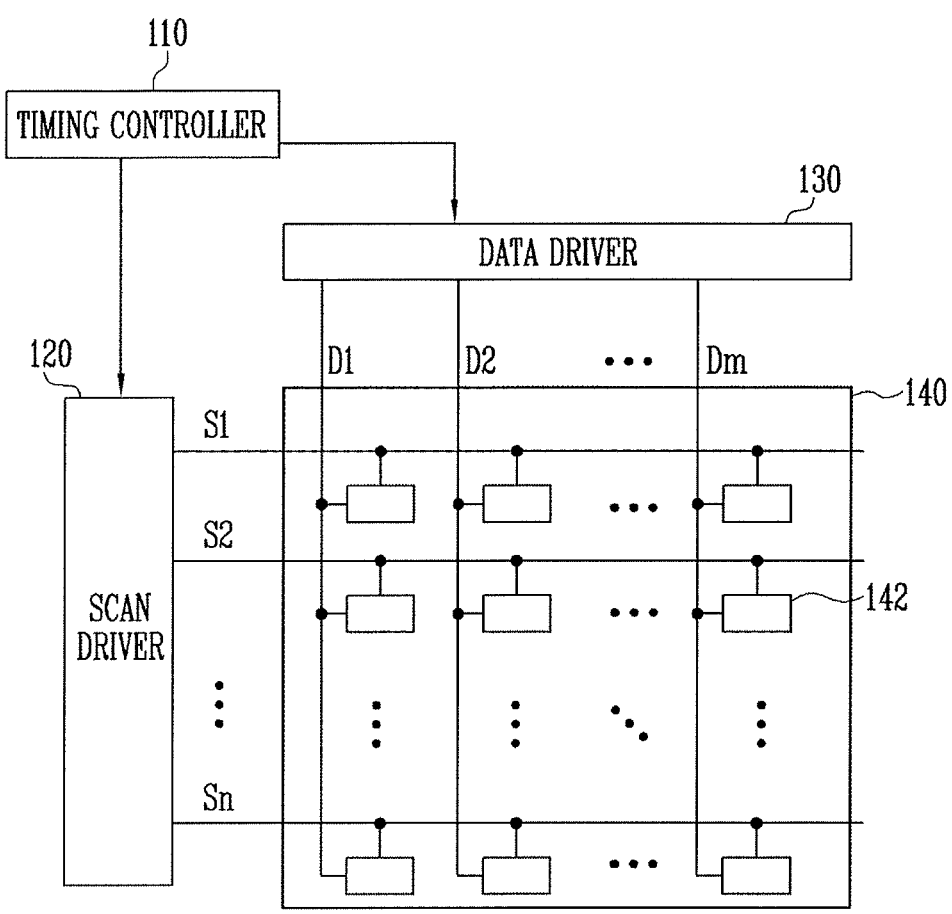
FIG. 2 illustrates an embodiment of a light emitting device.

FIG. 2 illustrates an embodiment of a light emitting device which includes one or more bar-type LEDs. Referring to FIG. 2, the light emitting device includes a timing controller 110, a scan driver 120, a data driver 130, and a light emitting unit 140. When the light emitting device is a light emitting display device, the light emitting unit 140 may correspond to the entire pixel region of a display panel.

The timing controller 110 receives various control signals and image data, from an external source (e.g., a system for transmitting image data), for driving light emitting unit 140. The timing controller 110 realigns the received image data and transmits the realigned image data to the data driver 130. Also, timing controller 110 generates scan control signals and data control signals for driving the scan and data drivers 120 and 130.

The scan driver 120 receives a scan control signal from the timing controller 110 and generates a scan signal corresponding to the scan control signal. The scan signal from the scan driver 120 is supplied to unit light emitting regions (e.g., pixels) 142 through scan lines S1 to Sn.

The data driver 130 receives a data control signal and image data from the timing controller 110 and generates data signals corresponding to the data control signal and the image data. The data signals are output from the data driver 130 to data lines D1 to Dm. The data signals output to the data lines D1 to Dm are input to unit light emitting regions 142 on a horizontal pixel line selected by the scan signal.

The light emitting unit 140 includes a plurality of unit light emitting regions 142 connected to the scan lines S1 to Sn and the data lines D1 to Dm. In one embodiment, the unit light emitting regions 142 may correspond to individual pixels.

Each of the unit light emitting regions 142 may include at least one bar-type LED as shown in FIG. 1. For example, each of the unit light emitting regions 142 may include at least one first color bar-type LED, at least one second color bar-type LED, and/or a third color bar-type LED. The unit light emitting regions 142 selectively emit light based on corresponding data signals input from the data lines D1 to Dm when a scan signal is supplied from the scan lines S1 to Sn. For example, each of the unit light emitting regions 142 may emit light with a luminance corresponding to the data signals during each frame period. A unit light emitting region 142 that receives a data signal corresponding to the luminance of black does not emit light during a corresponding frame period, thereby displaying black. When light emitting unit 140 is a pixel unit of an active light emitting display panel, the light emitting unit 140 may be driven by further receiving first and second pixel power sources as well as the scan and data signals.

FIGS. 3A-3E illustrate various embodiments of a unit light emitting region of a light emitting device. The unit light emitting region may correspond, for example, to a pixel of a passive light emitting display panel. For convenience, a jth (j is a natural number) pixel on an ith (i is a natural number) horizontal pixel line is shown in FIGS. 3A-3E. The pixels in FIGS. 3A-3E may be, for example, red, green, blue, or white pixels. The pixels may emit light of a different color in another embodiment.

Figure 3A:
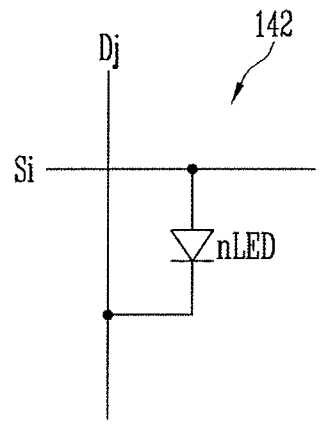
FIGS. 3A-3E illustrate various embodiments of unit light emitting regions of a light emitting device.

Referring to FIG. 3A, a pixel 142 includes a bar-type LED nLED connected between a scan line Si and a data line Dj. In some embodiments, a first electrode (e.g., anode electrode) of the bar-type LED nLED may be connected to the scan line Si. A second electrode (e.g., cathode electrode) of the bar-type LED nLED may be connected to the data line Dj. When a voltage equal to or greater than a threshold voltage is applied between the first electrode and the second electrode, the bar-type LED nLED emits light with a luminance corresponding to the magnitude of the applied voltage. The voltage of a scan signal applied to the scan line Si and/or a data signal applied to the data line Dj is adjusted, to thereby control light emission of the pixel 142.

Figure 3B:
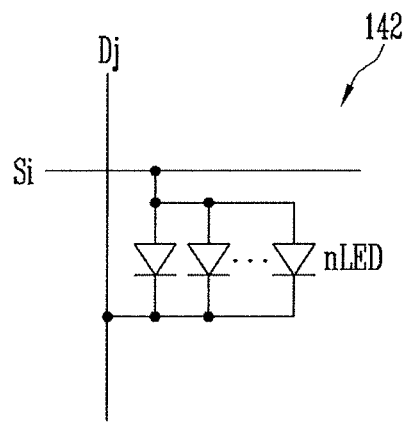

Referring to FIG. 3B, in some embodiments, pixel 142 may include at least two bar-type LEDs nLED connected in parallel. Luminance of the pixel 142 may correspond to the sum of brightnesses of the plurality of LEDs nLED of the pixel 142. When the pixel 142 includes a plurality of bar-type LEDs nLED, and particularly a large number of bar-type LEDs nLED, the pixel 142 may still operation even when one or more, but less than all, of the bar-type LEDs nLED in the pixel 142 are defective.

Figure 3C:
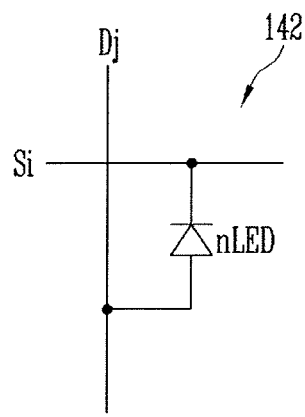

Referring to FIG. 3C, the connecting direction of the bar-type LEDs nLED in the pixel 142 may be different from other embodiments. For example, a first electrode (anode electrode) of the bar-type LED nLED may be connected to the data line Dj. A second electrode (cathode electrode) of the bar-type LED nLED may be connected to the scan line Si. For example, the direction of a voltage applied between the scan line Si and the data line Dj in FIG. 3A and the direction of a voltage applied between the scan line Si and the data line Dj in FIG. 3C may be opposite to each other.

Figure 3D:
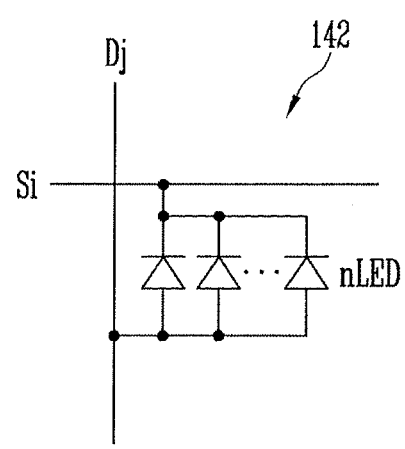

Referring to FIG. 3D, the pixel 142 in FIG. 3D may also include at least two bar-type LEDs nLED connected in parallel.

Figure 3E:
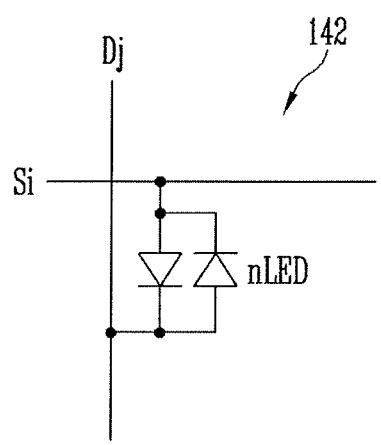

Referring to FIG. 3E, pixel 142 may include a plurality of bar-type LEDs nLED connected in different directions. For example, the pixel 142 may include at least one bar-type LED nLED having a first electrode (anode electrode) connected to the scan line Si and a second electrode (cathode electrode) connected to the data line Dj, and at least one bar-type LED nLED having a first electrode (anode electrode) connected to the data line Dj and a second electrode (cathode electrode) connected to the scan line Si.

In some embodiments, the pixel 142 in FIG. 3E may be DC driven or AC driven. When the pixel 142 in FIG. 3E is DC driven, forward connected bar-type LEDs nLED may emit light and reverse connected LEDs nLED may not emit light. When the pixel 142 of FIG. 3E is AC driven, forward connected bar-type LEDs nLED emit light according to the direction of an applied voltage. Thus, when the pixel 142 of FIG. 3E is AC driven, the bar-type LEDs nLED in the pixel 142 may alternately emit light according to the direction of the applied voltage.

Figure 4A:
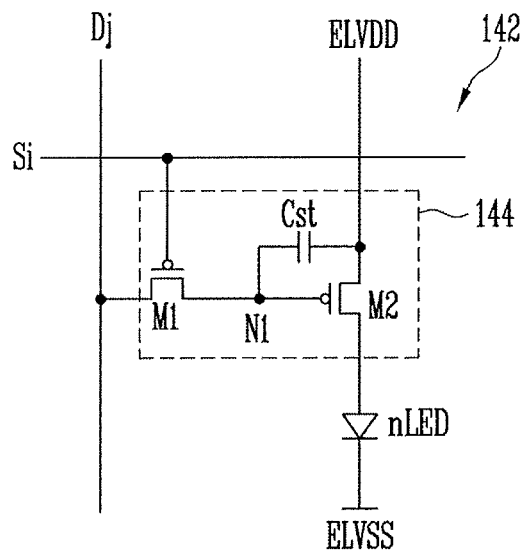
FIGS. 4A-4C illustrate various embodiments of unit light emitting regions of a light emitting device.
Figure 4B:
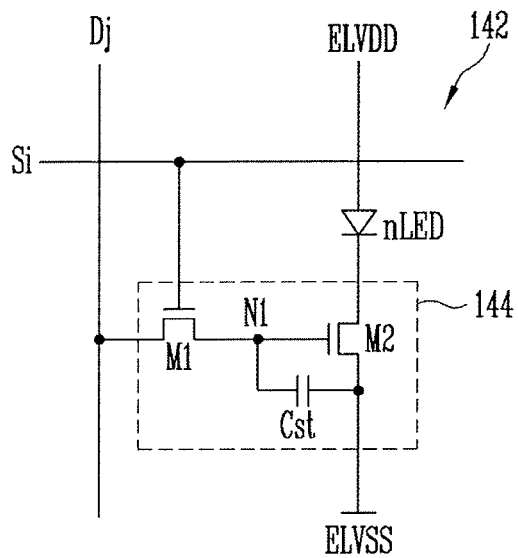
Figure 4C:
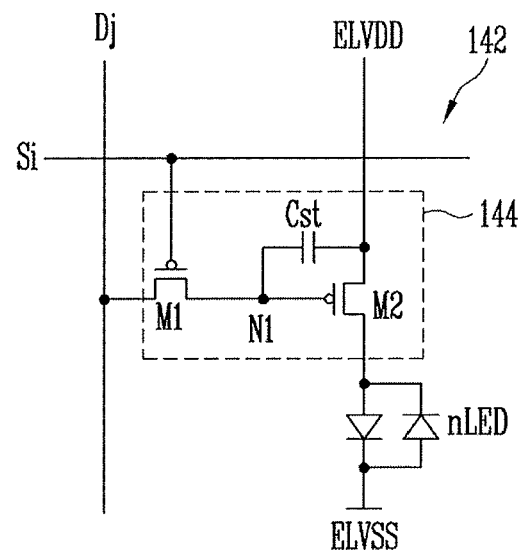

FIGS. 4A to 4C illustrate various circuit embodiments of unit light emitting regions of a light emitting. The unit light emitting regions are examples of pixels of an active light emitting display panel.

Referring to FIG. 4A, a pixel 142 includes a pixel circuit 144 connected at least one bar-type LED nLED. The bar-type LED nLED includes a first electrode (e.g., anode electrode) connected to a first pixel power source ELVDD via the pixel circuit 144, and a second electrode (e.g., cathode electrode) connected to a second pixel power source ELVSS. The first pixel power source ELVDD and the second pixel power source ELVSS may have different potentials. For example, the second pixel power source ELVSS may have a potential lower by a threshold voltage or more of the bar-type LED nLED than the first pixel power source ELVDD. Each of the bar-type LEDs nLED emits light with a luminance corresponding to a driving current controlled by pixel circuit 144.

Only one bar-type LED nLED is in pixel 142 in FIG. 4A. In another embodiment, pixel 142 may have multiple bar-type LEDs nLED connected in parallel.

In some embodiments, the pixel circuit 144 may include first and second transistors M1 and M2 and a storage capacitor Cst. The structure of the pixel circuit 144 may be different in another embodiment.

The first transistor (switching transistor) M1 includes a first electrode connected to a data line Dj and a second electrode connected to a first node N1. The first and second electrodes of the first transistor M1 are electrodes different from each other. For example, the first electrode may be a source electrode and the second electrode may be a drain electrode. A gate electrode of the first transistor M1 is connected to a scan line Si. The first transistor M1 is turned on when a scan signal having a voltage (e.g., a low voltage) at which the first transistor M1 can be turned on is supplied from the scan line Si. The data line Dj and the first node N1 are therefore electrically connected to each other. A data signal of a corresponding frame supplied to the data line Dj is transmitted to the first node N1. The data signal transmitted to the first node N1 is charged in the storage capacitor Cst.

The second transistor (driving transistor) M2 has a first electrode connected to the first pixel power source ELVDD and a second electrode connected to the first electrode of the bar-type LED nLED. A gate electrode of the second transistor M2 is connected to the first node N1. The second transistor M2 controls the amount of driving current supplied to the bar-type LED nLED based on a voltage of the first node N1.

The storage capacitor Cst has a first electrode connected to the first pixel power source ELVDD and a second electrode connected to the first node N1. The storage capacitor Cst charges a voltage corresponding to the data signal supplied to the first node N1 and maintains the charged voltage until a data signal of a next frame is supplied.

Thus, the pixel circuit 144 in FIG. 4A has a relatively simple structure, including the first transistor M1 for transmitting a data signal to the pixel 142, the storage capacitor Cst for storing the data signal, and the second transistor M2 for supplying, to the bar-type LED nLED, a driving current corresponding to the data signal. The structure of the pixel circuit 144 may be different in another embodiment. For example, the pixel circuit 144 may include at least one transistor element (such as a transistor element for compensating a threshold voltage of the second transistor M2, a transistor element for initializing the first node N1, and/or a transistor element for controlling a light emission time) or other circuit elements such as a boosting capacitor for boosting the voltage of the first node N1.

The transistors in the pixel circuit 144 are illustrated as p-type transistors in FIG. 4A. In another embodiment, at least one of the transistors in the pixel circuit 144 may be an n-type transistor.

Referring to FIG. 4B, the first and second transistors M1 and M2 are n-type transistors. The structure and/or operation of a pixel circuit 144 in FIG. 4B may be similar to pixel circuit 144 in FIG. 4A, except that the connecting positions of some components are changed due to the different transistor type.

Referring to FIG. 4C, a pixel 142 may include a plurality of bar-type LEDs nLED connected in different directions. The pixel 142 may be DC driven or AC driven, for example, as described in FIG. 3E.

Figure 5:
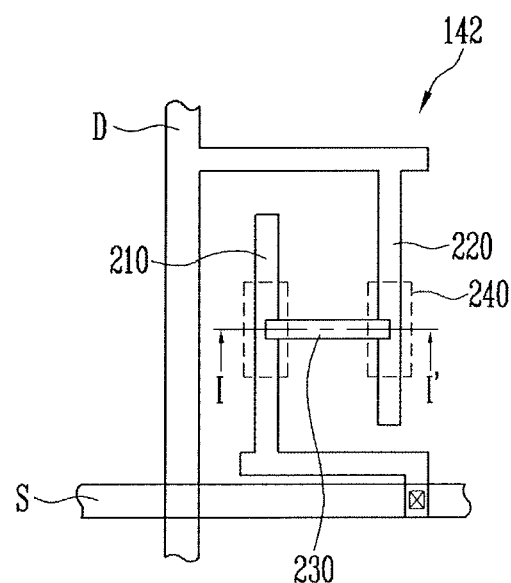
FIG. 5 illustrates an embodiment of a unit light emitting region of a light emitting device.
Figure 6:
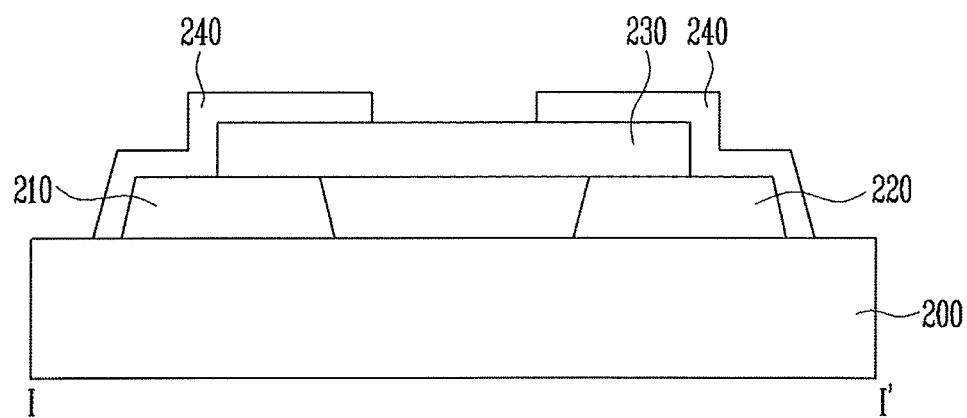
FIG. 6 illustrates a view along section line I-I' in FIG. 5.

FIG. 5 illustrates another embodiment of a unit light emitting region of a light emitting device. A pixel of a light emitting display panel may include the light emitting device in FIG. 5. In one embodiment, a one bar-type LED may be provided in the unit light emitting region in FIG. 5. In another embodiment, a plurality of bar-type LEDs may be in the unit light emitting region. FIG. 6 is a sectional view taken along line I-I' in FIG. 5.

Referring to FIG. 5, the bar-type LED is aligned in the horizontal direction. In another embodiment, alignment of the bar-type LED may be different, e.g., the bar-type LED may be aligned in an oblique direction between first and second electrodes.

Referring to FIGS. 5 and 6, the unit light emitting region (e.g., a pixel 142) includes at least one pair of first and second electrode 210 and 220 spaced apart from each other on a substrate 200, and at least one bar-type LED 230 electrically connected between the first and second electrodes 210 and 220. The number of first and second electrodes 210 and 220 in the unit light emitting region (pixel) 142 and/or the number of bar-type LEDs 230 in the unit light emitting region 142 may be different in another embodiment. In some embodiments, unit light emitting region 142 may further include a conductive contact layer 240.

The first electrode 210 and the second electrode 220 are spaced apart from each other. In some embodiments, the first and second electrodes 210 and 220 may be spaced apart from each other at a distance shorter than the length of the bar-type LED 230. For example, the first and second electrodes 210 and 220 may be spaced apart from each other at a sufficient distance that ends of the bar-type LED 230 are connected between the first and second electrodes 210 and 220, while being stably located on the first and second electrodes 210 and 220, respectively. In another embodiment, when there exists another structure for electrically connecting the first and second electrodes 210 and 220 to the bar-type LED 230, the first and second electrode 210 and 220 may be spaced apart from each other at a distance equal to or greater than the length of the bar-type LED 230.

In some embodiments, the first and second electrodes 210 and 220 are disposed on the same plane, and may have the same height. If the first and second electrodes 210 and 220 have the same height, the bar-type LED 230 can be more stably located on the first and second electrodes 210 and 220.

The first electrode 210 is connected to a first electrode line and the second electrode 220 is connected to a second electrode line, to receive a predetermined power source or signal. For example, in the case of a passive light emitting device, the first electrode 210 may be connected to a scan line S to receive a scan signal and the second electrode 220 may be connected to a data line D to receive a data signal. In some embodiments, in the case of an active light emitting device, at least one of the first electrode 210 or the second electrode 220 may be connected to the pixel circuit 144 as at least one of FIGS. 4A to 4C.

In a process of at least aligning the bar-type LED 230 during a fabricating process of the light emitting device, the first and second electrodes 210 and 220 may be electrically connected to first and second shorting bars, respectively. The first shorting bar may be commonly connected to first electrodes of a plurality of bar-type LEDs 230 in a plurality of unit light emitting regions 142. The second shorting bar may be commonly connected to second electrodes of the plurality of bar-type LEDs 230.

When the bar-type LEDs 230 in the unit light emitting regions 142 are to be independently driven after the light emitting device is fabricated, connection between the first and second electrodes 210 and 220 of the plurality of bar-type LEDs 230 and the first and second shorting bars may be cut off. For example, the first and second shorting bars may be provided at the outside of a scribing line of a light emitting display panel, in which the light emitting unit 140 in FIG. 2 is formed. As a result, the first and second electrodes 210 and 220 may be separated from the first and second shorting bars at the same time when a scribing process is performed.

In some embodiments, the bar-type LED 230 may have one end on the first electrode 210 and another end on the second electrode 220. The conductive contact layer 240 may stably connect the bar-type LED 230 electrically and/or physically to the first and second electrodes 210 and 220. In some embodiments, the conductive contact layer 240 may be provided on ends of the bar-type LED 230.

The conductive contact layer 240 may include a transparent conductive material (e.g., ITO, IZO, or ITZO) to allow light emitted from the bar-type LED 230 to be transmitted therethrough. In another embodiment, the conductive contact layer 240 may include a different material or the conductive contact layer 240 may be omitted.

Figure 7:
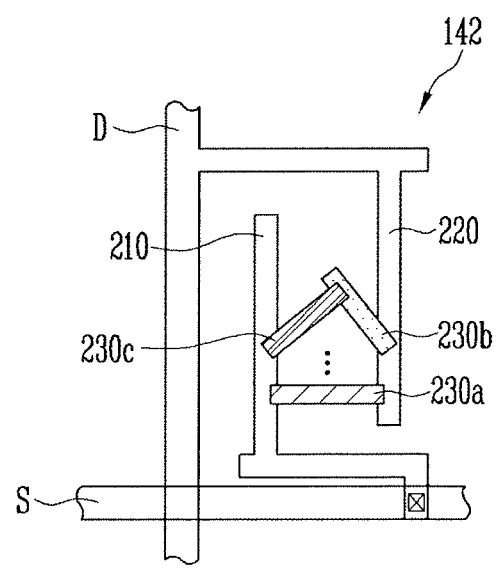
FIG. 7 illustrates an embodiment of a unit light emitting region of a light emitting device.

FIG. 7 illustrates another embodiment of a unit light emitting region of a light emitting device. Referring to FIG. 7, the unit light emitting region 142 includes a plurality of bar-type LEDs. For example, the unit light emitting region 142 may include a first bar-type LED 230a, a second bar-type LED 230b, and a third bar-type LED 230c between at least one pair of first and second electrodes 210 and 220. In another embodiment, the unit light emitting region 142 may include at least two bar-type LEDs in different layers among the at least one first bar-type LED 230a, the at least one second bar-type LED 230b, and the at least one third bar-type LED 230c.

In some embodiments, the first bar-type LED 230a, the second bar-type LED 230b, and the third bar-type LED 230c may be provided or formed in different layers on the substrate (e.g., 200 of FIG. 6), respectively. For example, the first bar-type LED 230a, the second bar-type LED 230b, and the third bar-type LED 230c may be in first, second, and third layers on the substrate 200, respectively. In addition, an insulating layer may be between the first bar-type LED 230a, the second bar-type LED 230b, and the third bar-type LED 230c.

In some embodiments, the first bar-type LED 230a, the second bar-type LED 230b, and the third bar-type LED 230c may be LEDs of different colors. In order to prevent mutual light interference, the bar-type LED 230a, 230b, or 230c emitting light of a relatively longer wavelength may be in a lower layer close to the substrate 200. The bar-type LED 230a, 230b, or 230c emitting light of a relatively short wavelength may be in an upper layer. For example, when assuming that the first, second, and third layers are sequentially located from a lower portion close to the substrate 200, red, green, and blue bar-type LEDs are in the first, second, and third layers, respectively. For example, the first bar-type LED 230a may be a red bar-type LED, the second bar-type LED 230b may be a green bar-type LED, and the third bar-type LED 230c may be a blue bar-type LED. However, the stacking order of the first bar-type LED 230a, the second bar-type LED 230b, and the third bar-type LED 230c is not necessarily determined based on wavelengths. In addition, the stacking height of the first bar-type LED 230a, the second bar-type LED 230b, and the third bar-type LED 230c may be different in another embodiment.

As described above, the unit light emitting region according to the present embodiment has a stack structure in which a plurality of bar-type LEDs 230a, 230b, and 230c are in a plurality of layers. At least one of the bar-type LEDs 230a, 230b, and 230c may be electrically connected between the first and second electrodes 210 and 220, and one end of each of the others may be electrically floated. For example, the first bar-type LED 230a may be electrically connected between the first and second electrodes 210 and 220. The first bar-type LED 230a may be activated, when a driving voltage equal to or greater than a threshold voltage is applied between the first and second electrodes 210 and 220, to emit light of a first color.

In some embodiments, at least one end of the second bar-type LED 230b and the third bar-type LED 230c may be electrically floated. Thus, even though the driving voltage is applied to the first and second electrodes 210 and 220, the second bar-type LED 230b and the third bar-type LED 230c maintain a non-activated state.

The second bar-type LED 230b and the third bar-type LED 230c may serve as scattering particles for scattering light. For example, when the first bar-type LED 230a emits light, the second bar-type LED 230b and the third bar-type LED 230c may scatter, at various angles, light emitted from the first bar-type LED 230a. Accordingly, it is possible to improve light emission efficiency of the light emitting device.

The conductive contact layer 240 in FIGS. 5 and 6 is not in FIG. 7. In some embodiments, the conductive contact layer 240 may be additionally provided. For example, the conductive contact layer 240 may be additionally provided at connecting portions between the ends of the first bar-type LED 230a and the first and second electrodes 210 and 220.

Figure 8A:
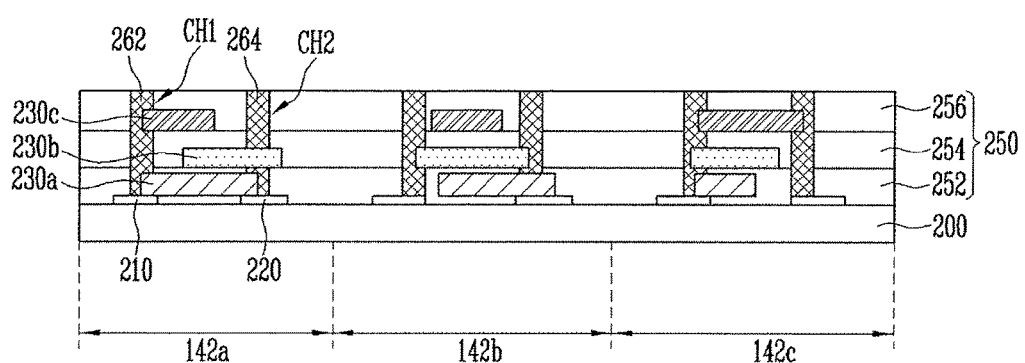
FIG. 8A illustrates a sectional view one region of a light emitting device according to an embodiment.
Figure 8B:
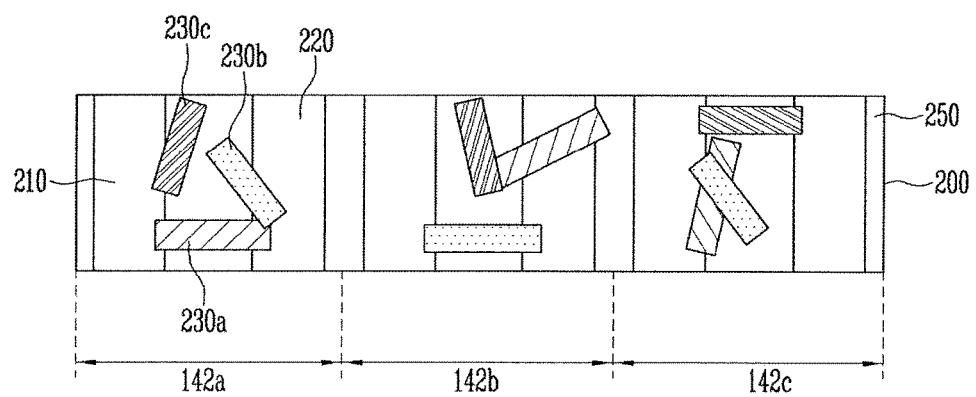
FIG. 8B illustrates a plan view of the one region of a light emitting device.

FIG. 8A is a sectional view illustrating one region of a light emitting device according to an embodiment. FIG. 8B illustrating a plan view of the one region of the light emitting device.

In FIG. 8A, first to third bar-type LEDs at least partially overlap each other for each unit light emitting region, in order to show positions of the first to third bar-type LEDs for every layer. For example, at least one portion of the first to third bar-type LEDs may be arbitrarily disposed on a pre-determined layer. FIG. 8B shows that the other bar-type LEDs, except a selectively aligned bar-type LED, may be arbitrarily located in a light emitting unit.

Referring to FIG. 8A, the light emitting device includes a plurality of unit light emitting regions on a substrate 200. For example, the light emitting device may include a first unit light emitting region 142a, a second unit light emitting region 142b, and a third unit light emitting region 142c, which are continuously disposed in a light emitting unit (e.g., 140 of FIG. 2) on the substrate 200. In some embodiments, a power line or signal lines (e.g., a data line, etc.) and/or a pixel defining layer, etc., may be additionally provided between the unit light emitting regions 142a, 142b, and 142c.

At least one of the unit light emitting regions 142a, 142b, and 142c includes a pair of first and second electrodes 210 and 220 spaced apart from each other, and a plurality of bar-type LEDs 230a, 230b, and/or 230c in at least two different layers. For example, each of the unit light emitting regions 142a, 142b, and 142c may include at least one pair of first and second electrodes 210 and 220, at least one first bar-type LED 230a in a first layer over the first and second electrodes 210 and 220, at least one second bar-type LED 230b in a second layer over the first layer, and at least one third bar-type LED 230c in a third layer over the second layer. In one embodiment, at least one of the unit light emitting regions 142a, 142b, and 142c includes at least one first bar-type LED 230a in the first layer and at least one second bar-type LED 230b in the second layer, and may not include the third bar-type LED 230c.

In some embodiments, an insulating layer 250 may be between and/or over the bar-type LEDs 230a, 230b, and 230c in different layers. For example, a first insulating layer 252 may be between the first bar-type LED 230a and the second bar-type LED 230b. A second insulating layer 254 may be between the second bar-type LED 230b and the third bar-type LED 230c. In addition, a third insulating layer 256 may be over the third bar-type LED 230c.

In some embodiments, the first bar-type LED 230a, the second bar-type LED 230b, and the third bar-type LED 230c, which are in different layers, may be LEDs of different colors. For example, the first bar-type LED 230a may be a bar-type LED emitting light of a first color (e.g., red) and the second bar-type LED 230b may be a bar-type LED emitting light of a second color (e.g., green). In addition, the third bar-type LED 230c may be a bar-type LED emitting light of a third color (e.g., blue).

At least one of the bar-type LEDs 230a, 230b, and/or 230c in each of the unit light emitting regions 142a, 142b, and 142c is electrically connected between the first electrode 210 and the second electrode 220. For example, the first bar-type LED 230a may be electrically connected between the first electrode 210 and the second electrode 220 in the first unit light emitting region 142a. In the first unit light emitting region 142a, at least one end of the second and third bar-type LEDs 230b and 230c may be electrically floated. In this case, the second and third bar-type LEDs 230b and 230c of the first unit light emitting region 142a maintain the non-activated state regardless of whether a driving voltage is applied. If the driving voltage is applied to the first unit light emitting region 142a, the first bar-type LED 230a may emit light of the first color in the first unit light emitting region 142a.

In some embodiments, the second bar-type LED 230b may be electrically connected between the first electrode 210 and the second electrode 220 in the second unit light emitting region 142b. In the second unit light emitting region 142b, at least one end of the first and third bar-type LEDs 230a and 230c may be electrically floated. In this case, the first and third bar-type LEDs 230a and 230c of the second unit light emitting region 142b maintain the non-activated state regardless of whether a driving voltage is applied. If the driving voltage is applied to the second unit light emitting region 230b, the second bar-type LED 230b may emit light of the second color in the second unit light emitting region 142b.

In some embodiments, the third bar-type LED 230c may be electrically connected between the first electrode 210 and the second electrode 220 in the third unit light emitting region 142c. In the third unit light emitting region 142c, at least one end of the first and second bar-type LEDs 230a and 230b may be electrically floated. In this case, the first and second bar-type LEDs 230a and 230b of the third unit light emitting region 142c maintain the non-activated state regardless of whether a driving voltage is applied. If the driving voltage is applied to the third unit light emitting region 142c, the third bar-type LED 230c may emit light of the third color in the third unit light emitting region 142c. The first to third unit light emitting regions 142a, 142b, and 142c, which emit light of different colors, may correspond to one unit pixel of the light emitting device.

In some embodiments, a first contact electrode 262 may be buried in a first contact hole CH1 penetrating the first, second, and third insulating layers 252, 254, and 256. The first contact hole CH1 exposes at least one portion of the first electrode 210. The first contact electrode 262 electrically connects, to the first electrode 210, one end of at least one of the first to third bar-type LEDs 230a, 230b, and 230c in each of the unit light emitting regions 142a, 142b, and 142c. For example, the first contact electrode 262 may electrically connect, to the first electrode 210, one ends of the bar-type LEDs 230a, 230b, and 230c overlapping the first electrode 210.

In some embodiments, a second contact electrode 264 may be buried in a second contact hole CH2 penetrating the first, second, and third insulating layers 252, 254, and 256. The second contact hole CH2 exposes at least one portion of the second electrode 220. The second contact electrode 264 electrically connects, to the second electrode 220, one end of at least one of the first to third bar-type LEDs 230a, 230b, and 230c in each of the unit light emitting regions 142a, 142b, and 142c. For example, the second contact electrode 264 may electrically connect, to the second electrode 220, the other ends of the bar-type LEDs 230a, 230b, and 230c overlapping with the second electrode 220.

In the sectional view of FIG. 8A, lengths of the first to third bar-type LEDs 230a, 230b, and 230c in each of the unit light emitting regions 142a, 142b, and 142c are different from one another. In some embodiments, the first to third bar-type LEDs 230a, 230b, and 230c may have lengths similar or substantially equal to one another. When the bar-type LEDs 230a, 230b, and/or 230c, having at least one floated end in each of the unit light emitting regions 142a, 142b, and 142c, are in oblique directions, the bar-type LEDs 230a, 230b, and/or 230c may be shown as if their lengths are short.

Referring to FIG. 8B, the bar-type LEDs 230a, 230b, and/or 230c, having at least one floated end in each of the unit light emitting regions 142a, 142b, and 142c, are arbitrarily disposed between the first and second electrodes 210 and 220. For example, the bar-type LEDs 230a, 230b, and/or 230c may be in oblique directions.

As described above, when a light emitting device has a stack structure with first to third bar-type LEDs 230a, 230b, and 230c in different layers, light emission efficiency of the light emitting device may be improved as in FIG. 7. In addition, the stacked structure of the light emitting device allows a corresponding fabrication method to be easily performed.

Figure 9:
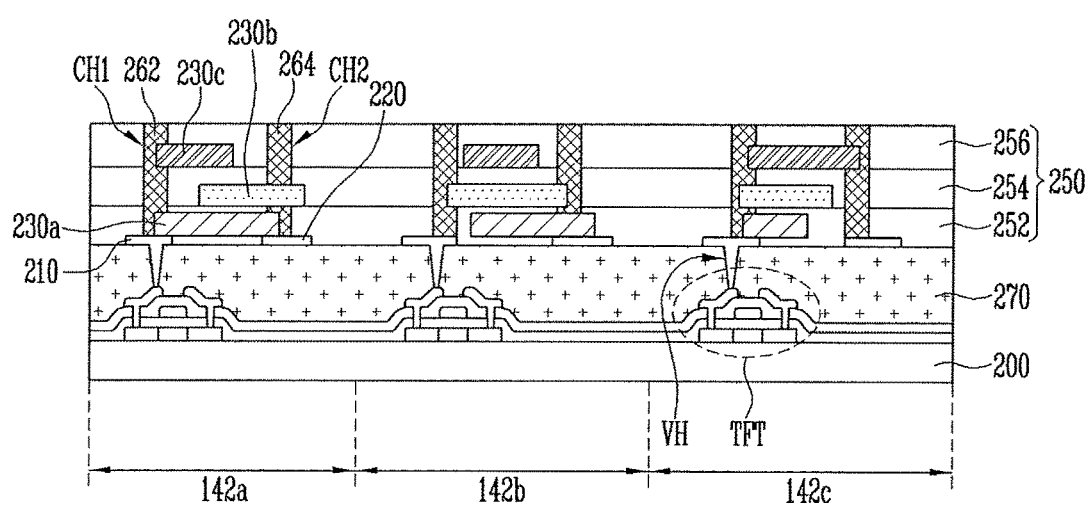
FIG. 9 illustrates a section view of one region of a light emitting device according to another embodiment.

FIG. 9 is a sectional view illustrating one region of a light emitting device according to another embodiment. Referring to FIG. 9, circuit elements such as transistors TFT and an insulating layer 270 covering the circuit elements may be further provided under first and second electrodes 210 and 220 and bar-type LEDs 230a, 230b, and 230c. For example, the transistors TFT may be electrically connected to the first electrode 210 through via holes VH formed in the insulating layer 270.

In addition, other transistors and/or a capacitor, etc., may be formed under the first and second electrodes 210 and 220 and the bar-type LEDs 230a, 230b, and 230c. For example, circuit elements of a pixel circuit as shown in any of FIGS. 4A-4C may be in each of unit light emitting regions 142a, 142b, and 142c. In some embodiments, a reflective layer, etc., may be under each of the bar-type LEDs 230a, 230b, and 230c.

FIGS. 10A-10E are sectional views illustrating various stages of an embodiment of a method for fabricating the light emitting device shown in FIG. 8A. FIGS. 11A-11C are plan views of one region of the light emitting device in FIGS. 10A-10C.

In FIGS. 10A-10E, the first to third bar-type LEDs at least partially overlap each other for each unit light emitting region, thus showing positions of the first to third bar-type LEDs for every layer. In one embodiment, at least one portion of the first to third bar-type LEDs may be on a predetermined layer. In addition, FIGS. 11A-11C show that the other bar-type LEDs, except a selectively aligned bar-type LED, may be in a light emitting unit.

Figure 10A:
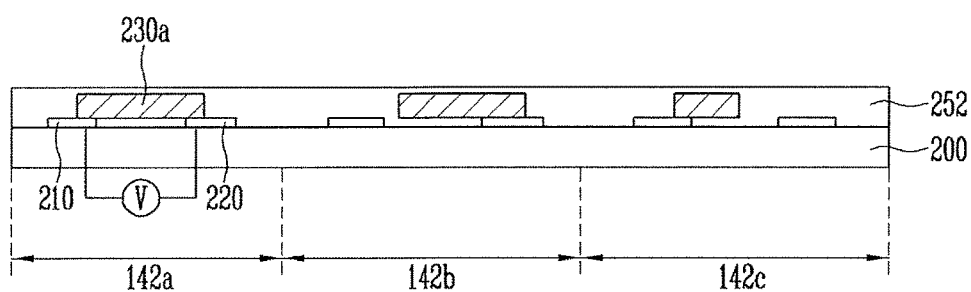
FIGS. 10A-10E illustrate various stages of an embodiment of a method for fabricating the light emitting device in FIG. 8A.
Figure 11A:
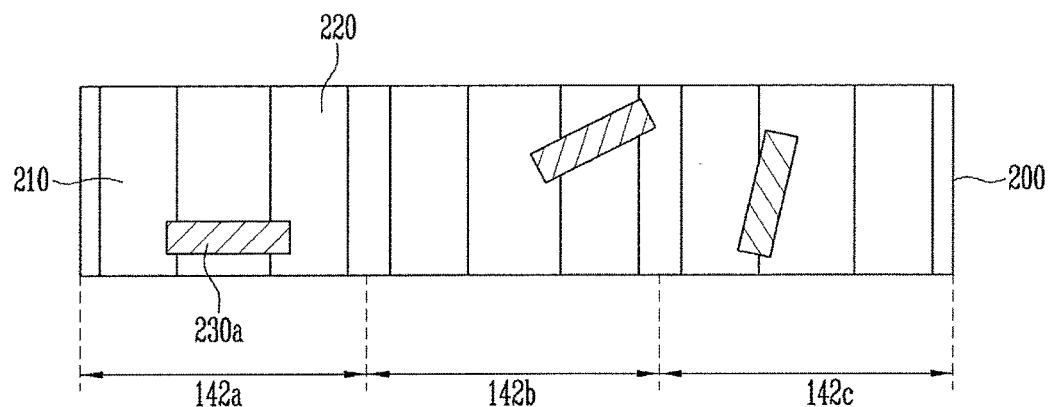
FIGS. 11A-11C illustrate embodiments of one region of the light emitting devices in FIGS. 10A-10C.
Figure 11B:
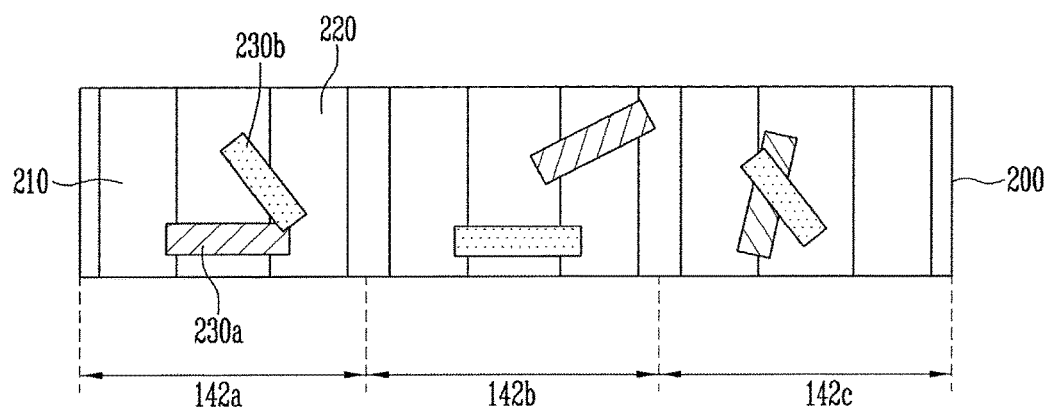
Figure 11C:
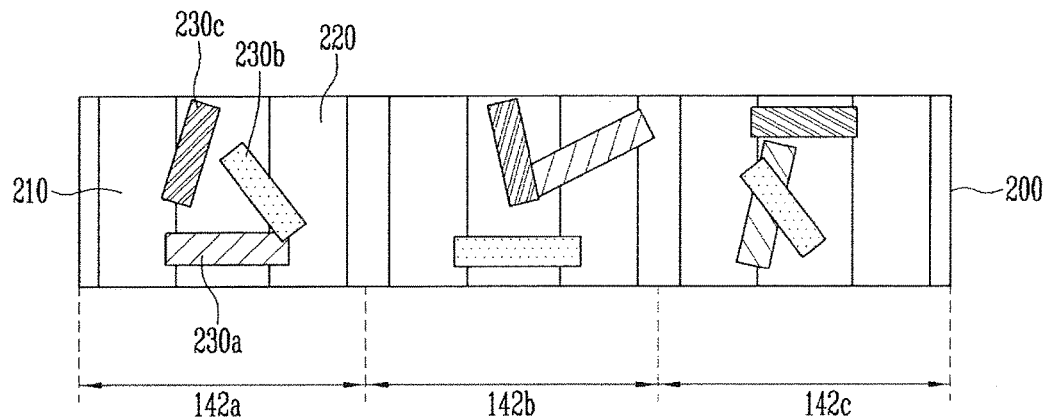

Referring to FIGS. 10A and 11A, at least one pair of first and second electrodes 210 and 220 are first formed in each of unit light emitting regions 142a, 142b, and 142c on a substrate 200. At least one first bar-type LED 230a is then injected and/or scattered into the unit light emitting regions 142a, 142b, and 142c. An inkjet printing technique is a non-restrictive example of injecting the first bar-type LED 230a. For example, a solution including a plurality of first bar-type LEDs 230a may be dropped or coated on the front of a light emitting unit including the unit light emitting regions 142a, 142b, and 142c. The solution may have an ink or paste phase. For example, a photoresist or organic layer containing a solvent may be used as the solution.

After the first bar-type LEDs 230a are injected, or at the same time when the first bar-type LEDs 230a are injected, at least one first bar-type LED 230a may be aligned between the first and second electrodes 210 and 220 in at least one unit light emitting region (142a, 142b, and/or 142c). For example, as a DC or AC voltage is applied to the first and second electrodes 210 and 220 of a desired unit light emitting region, e.g., a first unit light emitting region 142a, self-alignment of the first bar-type LED 230a may be induced such that both ends of the first bar-type LED 230a are respectively located on the first and second electrodes 210 and 220 on the first unit light emitting region 142a.

When a voltage is applied to the first and second electrodes 210 and 220, dipolarity is induced to the first bar-type LED 230a by an electric field formed between the first and second electrodes 210 and 220. Accordingly, the first bar-type LED 230a is self-aligned between the first and second electrodes 210 and 220.

A first insulating layer 252 is formed over the first bar-type LEDs 230a. The injection or coating of an insulating material for forming the first insulating layer 252 may be simultaneously performed with the injection of the first bar-type LEDs 230a, or may be performed after the injection of the first bar-type LEDs 230a. For example, as a solution including the first bar-type LEDs 230a and an insulating material for forming the first insulating layer 252 is dropped, the injection of the first bar-type LEDs 230a and the injection or coating of the insulating material for forming the first insulating layer 252 may be simultaneously performed. After the first bar-type LEDs 230a are self-aligned, the insulating material may be cured to form the first insulating layer 252.

In some embodiments, after the injection and self-alignment of the first bar-type LEDs 230a are completed, the insulating material may be dropped or coated on the first bar-type LEDs 230a, thereby forming the first insulating layer 252.

Figure 10B:
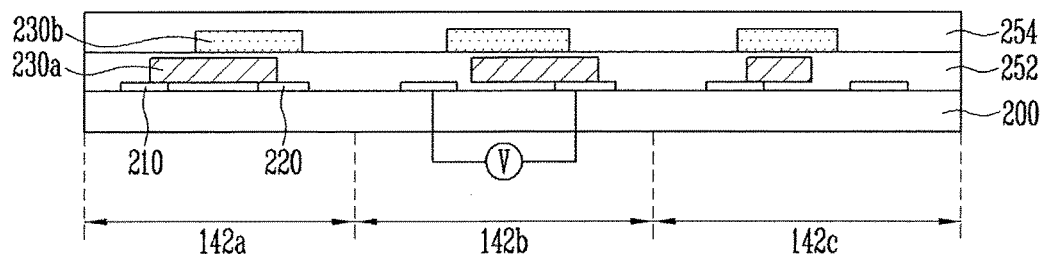

Referring to FIGS. 10B and 11B, at least one second bar-type LED 230b is injected into the unit light emitting regions 142a, 142b, and 142c on which the first insulating layer 252 is formed. For example, a solution including a plurality of second bar-type LEDs 230b may be dropped or coated on the front of the light emitting unit including the unit light emitting regions 142a, 142b, and 142c.

After the second bar-type LEDs 230b are injected or at the same time when the second bar-type LEDs 230b are injected, at least one second bar-type LED 230b may be aligned between the first and second electrodes 210 and 220 in at least one unit light emitting region 142a, 142b, and/or 142c. For example, as a DC or AC voltage is applied to the first and second electrodes 210 and 220 of the second unit light emitting region 142b, self-alignment of the second bar-type LED 230b may be induced such that both ends of the second bar-type LED 230b are respectively located on the first and second electrodes 210 and 220 of the second unit light emitting region 142b. A second insulating layer 254 is formed over the second bar-type LEDs 230b.

Figure 10C:
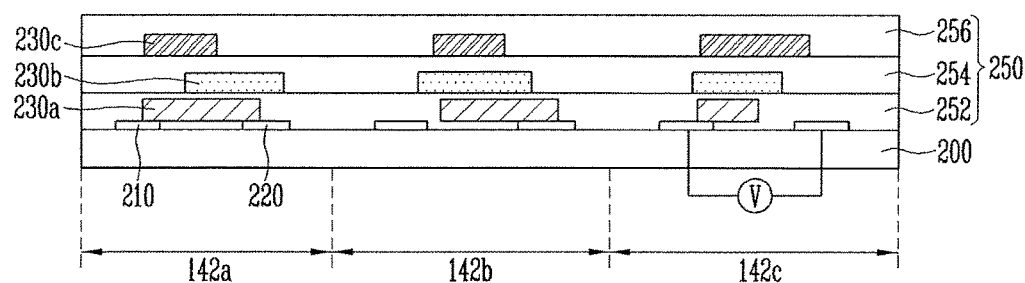

Referring to FIGS. 10C and 11C, at least one third bar-type LED 230c is injected into the unit light emitting regions 142a, 142b, and 142c on which the second insulating layer 254 is formed. For example, a solution including a plurality of third bar-type LEDs 230c may be dropped or coated on the front of the light emitting unit including the unit light emitting regions 142a, 142b, and 142c.

After the third bar-type LEDs 230c are injected or at the same time when the third bar-type LEDs 230c are injected, at least one third bar-type LED 230c may be aligned between the first and second electrodes 210 and 220 formed in at least one unit light emitting region 142a, 142b, and/or 142c. For example, as a DC or AC voltage is applied to the first and second electrodes 210 and 220 of the third unit light emitting region 142c, self-alignment of the third bar-type LED 230c may be induced such that ends of the third bar-type LED 230c are respectively located on the first and second electrodes 210 and 220 of the third unit light emitting region 142c. A third insulating layer 256 is formed over the third bar-type LEDs 230c.

Figure 10D:
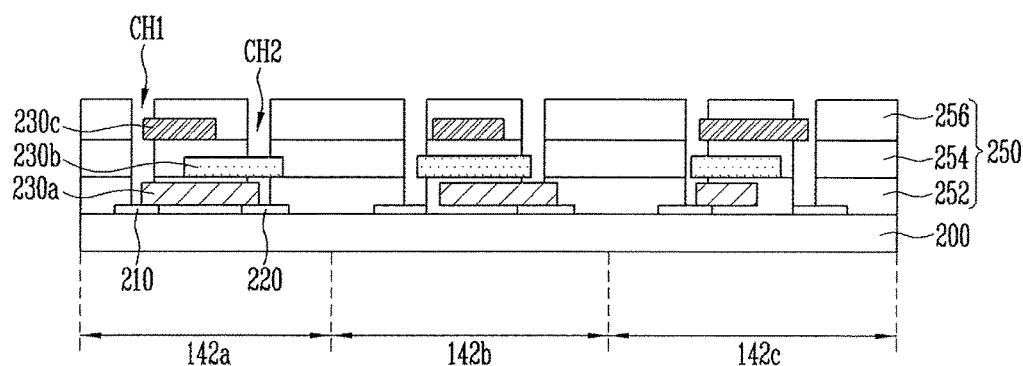

Referring to FIG. 10D, after the first, second, and third bar-type LEDs 230a, 230b, and 230c are formed, a first contact hole CH1 and a second contact hole CH2 are formed in each of the unit light emitting regions 142a, 142b, and 142c. In some embodiments, the first contact hole CH1 and the second contact hole CH2 may penetrate the first, second, and third insulating layers 252, 254, and 256. For example, the first contact hole CH1 may penetrate the first, second, and third insulating layers 252, 254, and 256 to expose one end of at least one of the first, second, and third bar-type LEDs 230a, 230b, and 230c and at least one region of the first electrode 210. The second contact hole CH2 may penetrate the first, second, and third insulating layers 252, 254, and 256 to expose the other end of at least one of the first, second, and third bar-type LEDs 230a, 230b, and 230c and at least one region of the second electrode 220.

Figure 10E:
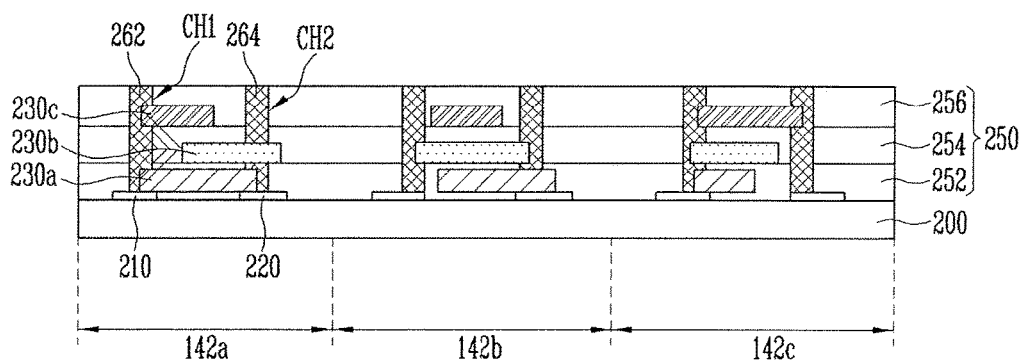

Referring to FIG. 10E, at the same time when a first contact electrode 262 is formed to be buried in the first contact hole CH1, a second contact electrode 264 is formed to be buried in the second contact hole CH2. In some embodiments, the first contact electrode 262 and the second contact electrode 264 may be sequentially formed. Accordingly, the first contact electrode 262 electrically connects the first electrode 210 to one end of at least one of the first, second, and third bar-type LEDs 230a, 230b, or 230c. For example, the first contact electrode 262 of the first unit light emitting region 142a electrically connects the first electrode 210 to one end of at least one first bar-type LED 230a. The second contact electrode 264 electrically connects the second electrode 220 to the other end of at least one of the first, second, and third bar-type LEDs 230a, 230b, or 230c. For example, the second contact electrode 264 of the first unit light emitting region 142a electrically connects the second electrode 220 to the other end of at least one first bar-type LED 230a.

As described above, a light emitting device having a stack structure is configured by disposing the first, second, and third bar-type LEDs 230a, 230b, and 230c in different layers. A process for fabricating the light emitting device may therefore be easily performed.

In a comparative example, if the size of each of the unit light emitting regions 142a, 142b, and 142c is relatively small when only a bar-type LED 230a, 230b, or 230c of a desired color is to be injected into each of the unit light emitting regions 142a, 142b, and 142c, it may be difficult to inject a desired bar-type LED 230a, 230b, or 230c at a desired position. For example, when a solution including the bar-type LED 230a, 230b, or 230c is to be injected into a desired unit light emitting region 142a, 142b, or 142c using an inkjet printing technique, a high-resolution printing technique performed in units of sub-pixels may be required. Therefore, the level of difficulty of the process may be increased. In addition, since cohesion and precipitation of the bar-type LED 230a, 230b, and/or 230c easily occur, it may be difficult to inject the bar-type LED 230a, 230b, and/or 230c into each of the unit light emitting regions 142a, 142b, and 142c.

However, in one or more embodiments, when the first to third bar-type LEDs 230a, 230b, and 230c are disposed in different layers, the first bar-type LEDs 230a, the second bar-type LEDs 230b, or the third bar-type LEDs 230c may be dropped or scattered on the front of the light emitting unit including the unit light emitting regions 142a, 142b, and 142c for each layer, without distinguishing the unit light emitting regions 142a, 142b, and 142c from one another. Accordingly, the process for fabricating the light emitting device may be easily performed, and uniformity of the bar-type LEDs 230a, 230b, and 230b may be improved.

In addition, after the bar-type LEDs 230a, 230b, and/or 230c are injected into the light emitting unit, the voltage applied to the first and second electrodes 210 and 220 for each of the unit light emitting regions 142a, 142b, and 142c is controlled, so that only a desired kind of bar-type LED 230a, 230b, and/or 230c may be selectively aligned between the first and second electrodes 210 and 220 of a corresponding unit light emitting region 142a, 142b, or 142c.

In some embodiments, when the first to third bar-type LEDs 230a, 230b, and 230c are self-aligned, magnitudes of voltages (e.g., the absolute values of voltages) applied to the first and second electrodes 210 and 220 of corresponding unit light emitting regions 142a, 142b, and 142c may be the same or different from one another. For example, the magnitude of a voltage applied to the first and second electrodes 210 and 220 of a corresponding unit light emitting region 142a, 142b, or 142c may be adjusted based on a distance variation between the first and second electrodes 210 and 220 and the bar-type LED 230a, 230b, or 230c to be self-aligned in each of the unit light emitting regions 142a, 142b, and 142c. For example, the magnitude of a voltage applied for each of the unit light emitting regions 142a, 142b, and 142c may be set such that, when the first to third bar-type LEDs 230a, 230b, and 230c are self-aligned, the intensities of electric fields applied to the first to third bar-type LEDs 230a, 230b, and 230c are the substantially same.

In this case, the magnitude of a voltage applied to the first and second electrodes 210 and 220 of the second unit light emitting region 142b when the second bar-type LEDs 230b are self-aligned may be greater than that of a voltage applied to the first and second electrodes 210 and 220 of the first unit light emitting region 142a when the first bar-type LEDs 230a are self-aligned. For example, a first voltage may be applied between the first and second electrodes 210 and 220 of the first unit light emitting region 142a in the operation of self-aligning the first bar-type LEDs 230a, and a second voltage may be applied between the first and second electrodes 210 and 220 of the second unit light emitting region 142b in self-aligning the second bar-type LEDs 230b.

In addition, the magnitude of a voltage applied to the first and second electrodes 210 and 220 of the third unit light emitting region 142c when the third bar-type LEDs 230c are self-aligned may be greater than that of a voltage applied to the first and second electrodes 210 and 220 of the second unit light emitting region 142b when the second bar-type LEDs 230b are self-aligned. For example, a third voltage greater than the first and second voltages may be applied between the first and second electrodes 210 and 220 of the third unit light emitting region 142c in the operation of self-aligning the third bar-type LEDs 230c. Accordingly, when the first to third bar-type LEDs 230a, 230b, and 230c are self-aligned, a uniform electric field may be applied to the first to third bar-type LEDs 230a, 230b, and 230c.

Figure 12:
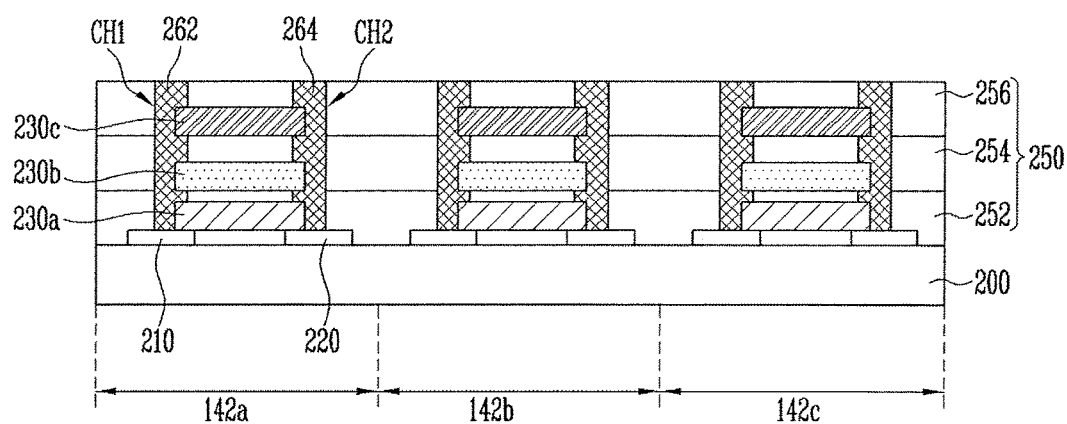
FIG. 12 illustrates a sectional view of one region of a light emitting device according to another embodiment.

FIG. 12 is a sectional view illustrating one region of a light emitting device according to another embodiment. Referring to FIG. 12, first ends of first, second, and third bar-type LEDs 230a, 230b, and 230c are commonly connected to a first electrode 210 through a first contact electrode 262, and the other ends of the first, second, and third bar-type LEDs 230a, 230b, and 230c are commonly connected to a second electrode 220 through a second contact electrode 264. Thus, in some embodiments, the first, second, and third bar-type LEDs 230a, 230b, and 230c may be commonly connected in a structure in which at least two bar-type LEDs 230a, 230b, and 230c formed in different layers in each of unit light emitting regions 142a, 142b, and 142c may be connected in parallel between the first and second electrodes 210 and 220.

In this case, each of the unit light emitting regions 142a, 142b, and 142c may emit white light. A lighting device may be used as an example of the light emitting device to which such a structure may be applied. In another embodiment, the structure of FIG. 12 may be applied to a light emitting display device. For example, the unit light emitting regions 142a, 142b, and 142c may constitute pixels emitting white light, respectively. In this case, as a color filter is disposed on a surface from light is emitted, pixels of desired colors may be implemented.

In the light emitting device according to the present embodiment, if a driving voltage is applied to the first and second electrodes 210 and 220 of at least one unit light emitting region 142a, 142b, and/or 142c, the first to third bar-type LEDs 230a, 230b, and 230c of the corresponding unit light emitting region 142a, 142b, and/or 142c emit light of corresponding colors, e.g., red, green, and blue, respectively. Accordingly, the corresponding unit light emitting region 142a, 142b, and/or 142c emits white light. In the light emitting device, all of the bar-type LEDs 230a, 230b, and 230c emit light in the same area. Accordingly, it is possible to sufficiently secure a light emission area.

Figure 13A:
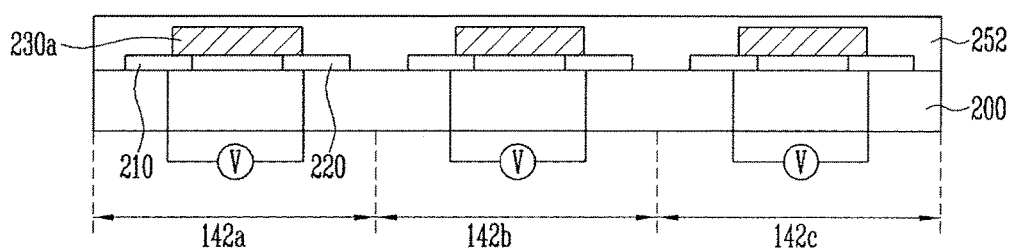
FIGS. 13A-13E illustrate various stages in another embodiment of a method for fabricating the light emitting device in FIG. 12.

FIGS. 13A-13E are sectional views of various stages of another embodiment of a method for fabricating the light emitting device in FIG. 12. Referring to FIG. 13A, after first bar-type LEDs 230a are injected, a voltage is applied to first and second electrodes 210 and 220 of each of first to third unit light emitting regions 142a, 142b, and 142c. Accordingly, ends of at least one first bar-type LED 230a are aligned on the first and second electrodes 210 and 220 in all of the first, second, and third unit light emitting regions 142a, 142b, and 142c. For example, the first bar-type LED 230a is aligned to be electrically connected between the first and second electrodes 210 and 220. In this case, a conductive contact layer for stably connecting ends of the first bar-type LED 230a physically and/or electrically to the first and second electrodes 210 and 220 may be further formed.

Figure 13B:
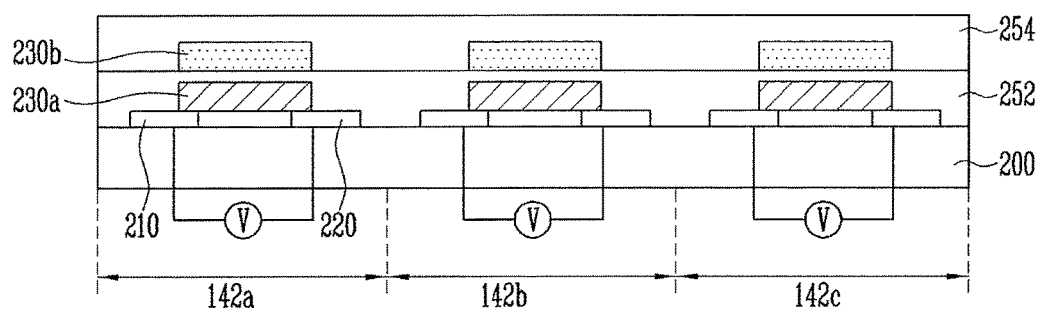

Referring to FIG. 13B, after second bar-type LEDs 230b are injected, a voltage is applied to the first and second electrodes 210 and 220 of each of the first to third unit light emitting regions 142a, 142b, and 142c. Accordingly, ends of at least one second bar-type LED 230b are aligned on the first and second electrodes 210 and 220 in all of the first, second, and third unit light emitting regions 142a, 142b, and 142c.

Figure 13C:
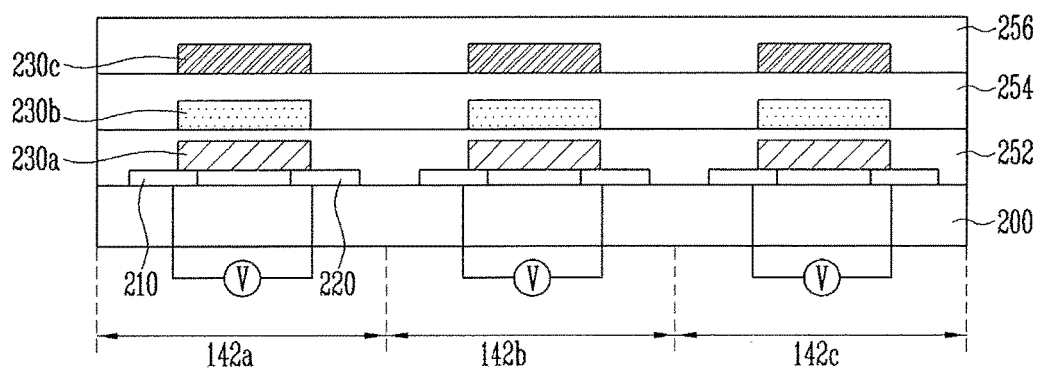

Referring to FIG. 13C, after third bar-type LEDs 230c are injected, a voltage is applied to the first and second electrodes 210 and 220 of each of the first to third unit light emitting regions 142a, 142b, and 142c. Accordingly, ends of at least one third bar-type LED 230c are aligned on the first and second electrodes 210 and 220 in all of the first, second, and third unit light emitting regions 142a, 142b, and 142c.

Figure 13D:
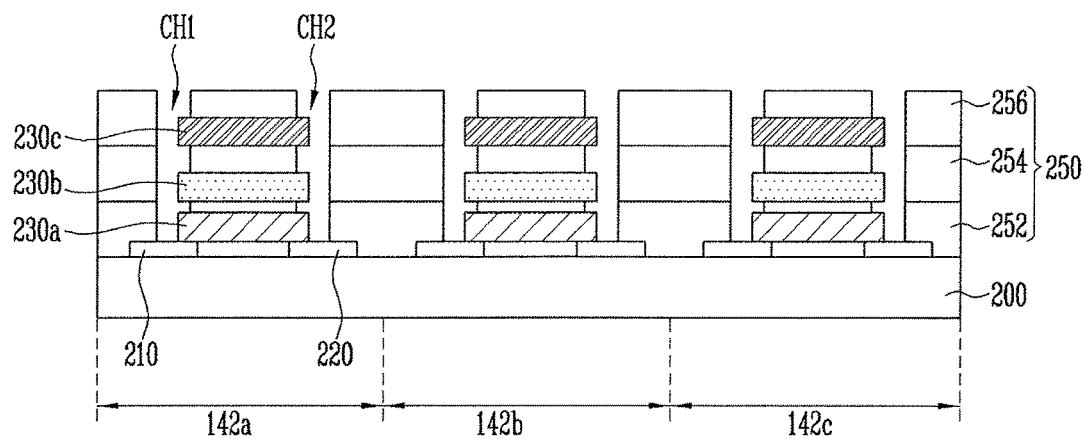

Referring to FIG. 13D, a first contact hole CH1 penetrating first, second, and third insulating layers 252, 254, and 256 is formed to expose the first electrode 210 and first ends of the first, second, and third bar-type LEDs 230a, 230b, and 230c. Simultaneously, a second contact hole CH2 penetrating the first, second, and third insulating layers 252, 254, and 256 may be formed to expose the second electrode 220 and second ends of the first, second, and third bar-type LEDs 230a, 230b, and 230c.

Figure 13E:
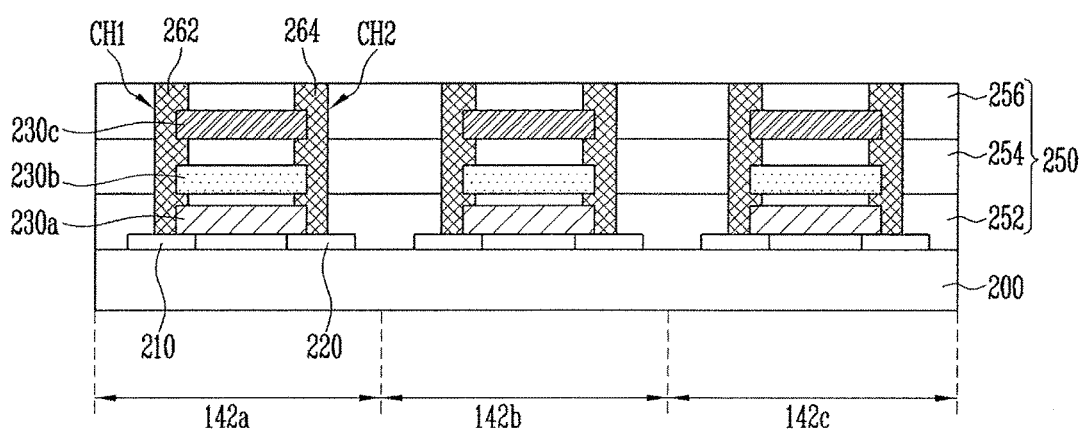

Referring to FIG. 13E, a first contact electrode 262 is formed in the first contact hole CH1, and simultaneously, a second contact electrode 264 is formed in the second contact hole CH2. In some embodiments, the first contact electrode 262 and the second contact electrode 264 may be sequentially formed.

In some embodiments, the first contact electrode 262 may commonly connect the first electrode 210 to first ends of the first, second, and third bar-type LEDs 230a, 230b, and 230c. In addition, the second contact electrode 264 may commonly connect the second electrode 220 to second ends of the first, second, and third bar-type LEDs 230a, 230b, and 230c.

Figure 14:
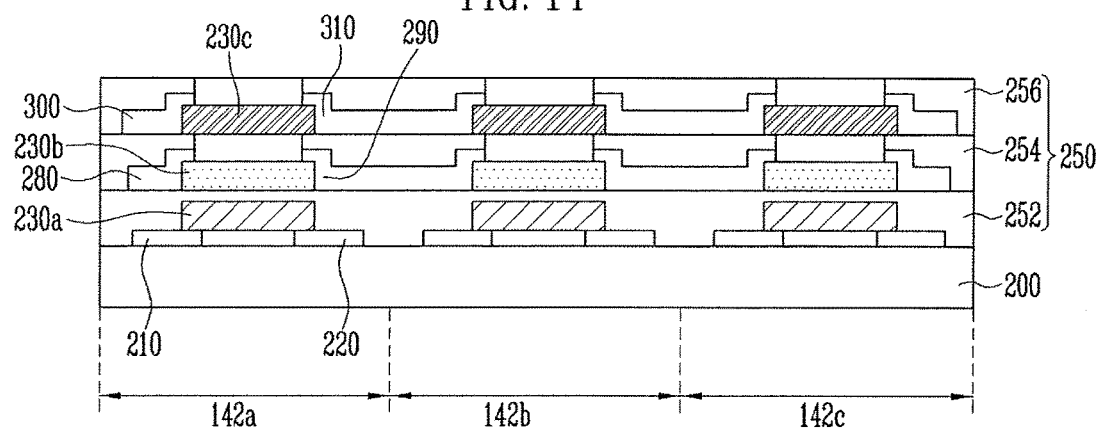
FIG. 14 illustrates a sectional view of one region of a light emitting device according to another embodiment.

FIG. 14 is a sectional view illustrating one region of a light emitting device according to another embodiment. Referring to FIG. 14, an individual driving electrode may be provided for each of first bar-type LEDs 230a, second bar-type LEDs 230b, and third bar-type LEDs 230c. For example, the light emitting device may include first and second electrodes 210 and 220 respectively connected first ends and the second ends of the first bar-type LEDs 230a, third and fourth electrodes 280 and 290 respectively connected first ends and the second ends of the second bar-type LEDs 230b, and fifth and sixth electrodes 300 and 310 respectively connected to first ends and the second ends of the third bar-type LEDs 230c.

In some embodiments, electrodes connected to corresponding ends of the bar-type LEDs 230a, 230b, and/or 230c connected, in series or parallel to each other, may be patterned such that the electrodes may be connected integrally with each other. In FIG. 14, the first and second electrodes 210 and 220 connected to ends of the first bar-type LEDs 230 are illustrated as separated patterns, so as to represent various embodiments related to electrode connection structures between the bar-type LEDs 230a, 230b, and 230c disposed in different layers. In addition, a structure in which the third, fourth, fifth and/or sixth electrode 280, 290, 300, and/or 310 connected at least one end of the second and third bar-type LEDs 230b and 230c is integrally connected to the third, fourth, fifth and/or sixth electrode 280, 290, 300, and/or 310 connected at least one end of adjacent second and third bar-type LEDs 230b and 230c is in FIG. 14. The connection structures of the bar-type LEDs 230a, 230b, and 230c in different layers may be different in other embodiments.

According to this embodiment described above, the first bar-type LEDs 230a, the second bar-type LEDs 230b, and the third bar-type LEDs 230c may be independently driven in each of the unit light emitting regions 142a, 142b, and 142c.

Figure 15A:
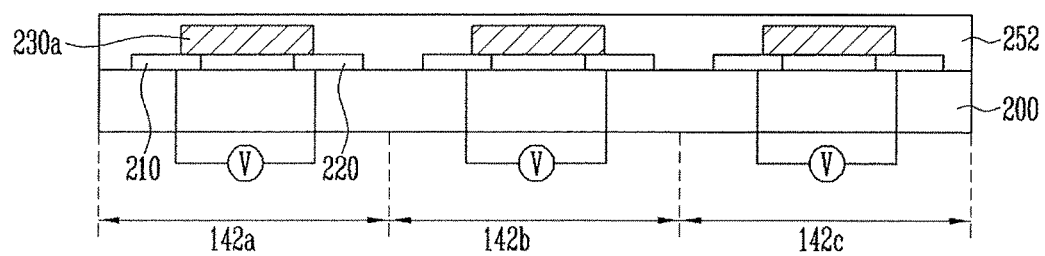
FIGS. 15A-15I illustrate various stages in another embodiment of a method for fabricating the light emitting device in FIG. 14.

FIGS. 15A-15I are sectional views of various stages of method for fabricating the light emitting device in FIG. 14. Referring to FIG. 15A, after first bar-type LEDs 230a are injected, a voltage is applied to first and second electrodes 210 and 220 of first, second, and third unit light emitting regions 142a, 142b, and 142c, thereby aligning the first bar-type LEDs 230a to be electrically connected between the first and second electrodes 210 and 220.

Figure 15B:
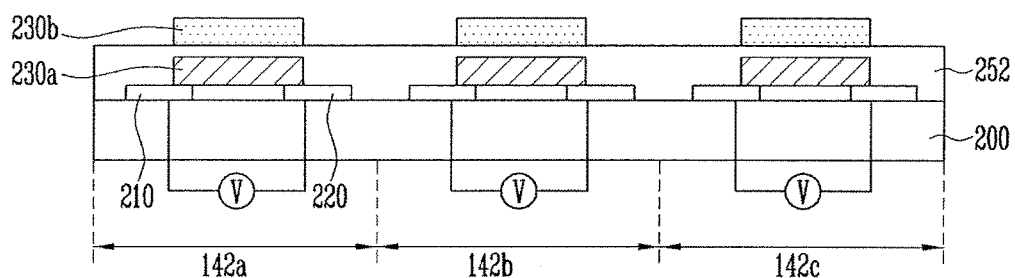

Referring to FIG. 15B, after second bar-type LEDs 230b are injected, a voltage is applied to the first and second electrodes 210 and 220 of the first, second, and third unit light emitting regions 142a, 142b, and 142c, thereby aligning the second bar-type LEDs 230b.

Figure 15C:
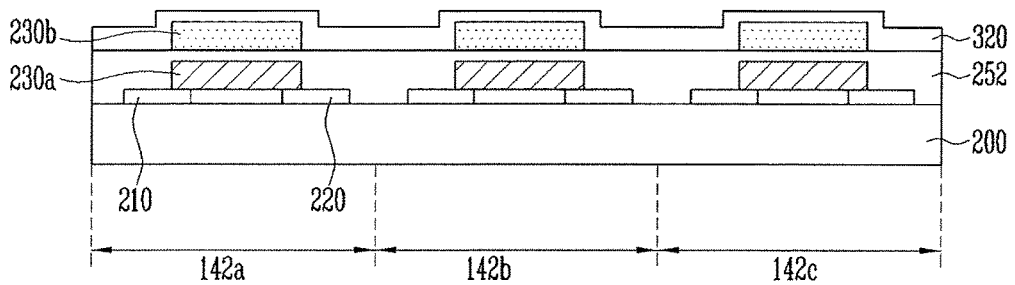
Figure 15D:
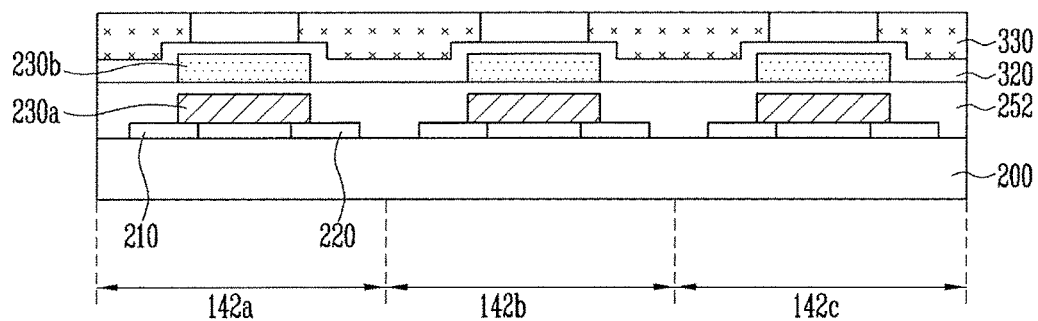
Figure 15E:
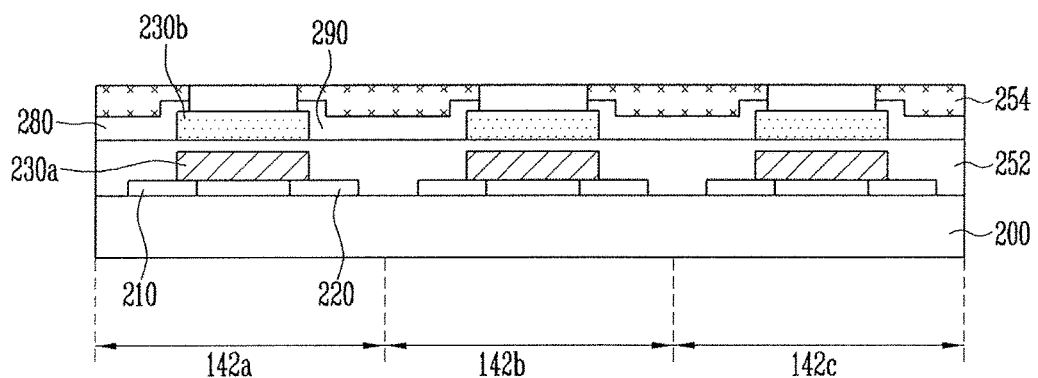

Referring to FIGS. 15C to 15E, a first conductive layer 320 is formed over the second bar-type LEDs 230b and a first mask 330 is formed on the first conductive layer 320. Then, the first conductive layer 320 is patterned using the first mask 330, thereby forming third and fourth electrodes 280 and 290. After that, a second insulating layer 254 is at least formed on the third and fourth electrodes 280 and 290. In some embodiments, the first mask 330 may include a photoresist material. In some embodiments, the first mask 330 may be etched by a predetermined thickness, thereby forming the second insulating layer 254.

Figure 15F:
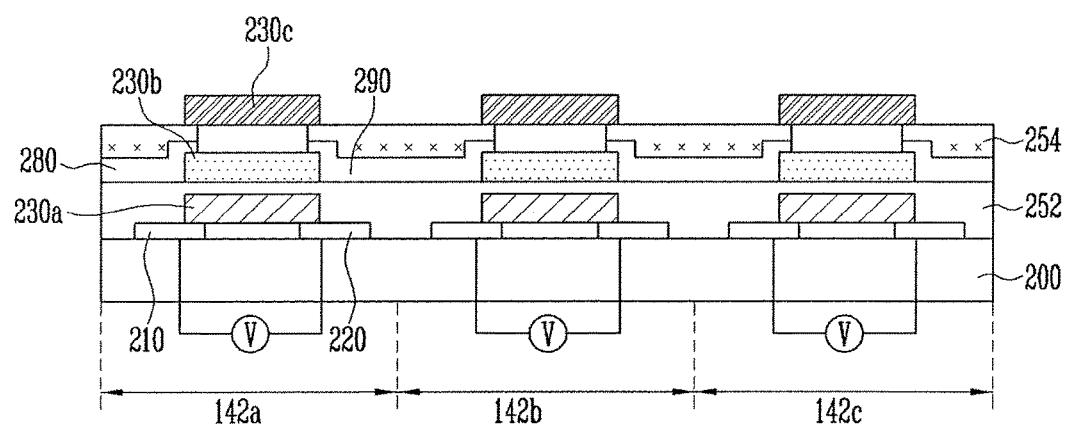

Referring to FIG. 15F, after third bar-type LEDs 230c are injected, a voltage is applied to the first and second electrodes 210 and 220 of the first, second, and third unit light emitting regions 142a, 142b, and 142c, to align the third bar-type LEDs 230c.

Figure 15G:
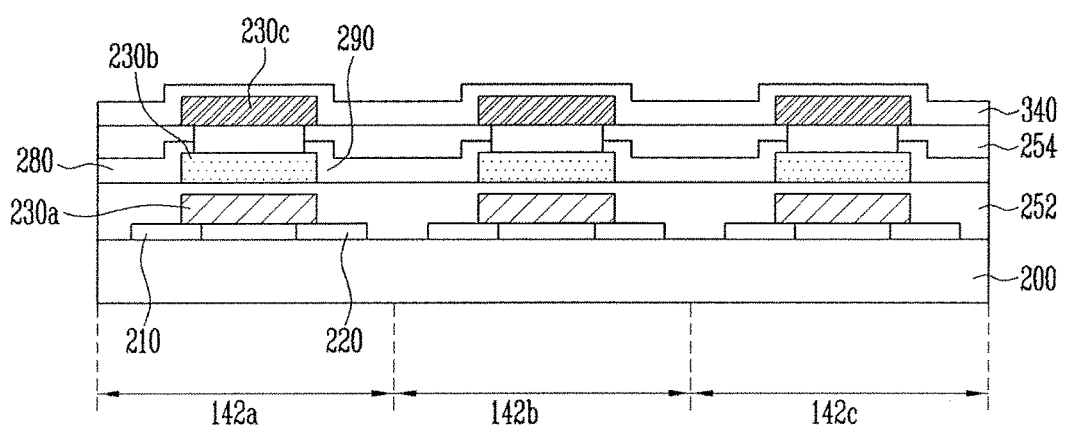
Figure 15H:
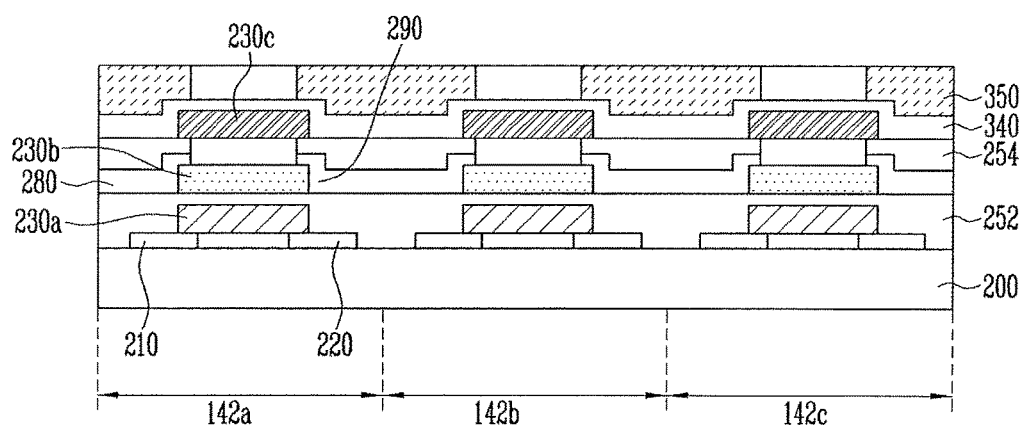
Figure 15I:
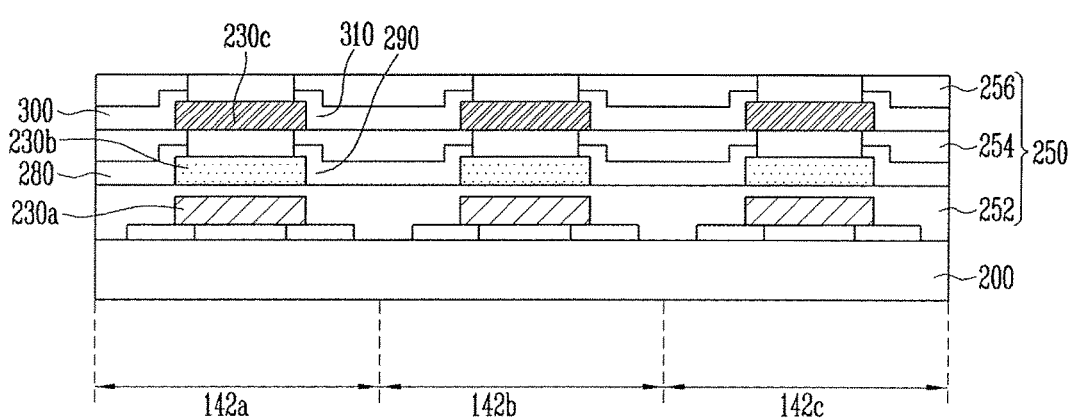

Referring to FIGS. 15G-15I, a second conductive layer 340 is formed over the third bar-type LEDs 230c and a second mask 350 is formed on the second conductive layer 340. Then, the second conductive layer 340 is patterned using the second mask 350, thereby forming fifth and sixth electrodes 300 and 310. Subsequently, a third insulating layer 256 is at least formed on the fifth and sixth electrodes 300 and 310. In some embodiments, the second mask 350 may include a photoresist material. In some embodiments, the second mask 350 may be etched by a predetermined thickness, thereby forming the third insulating layer 256.

Figure 16:
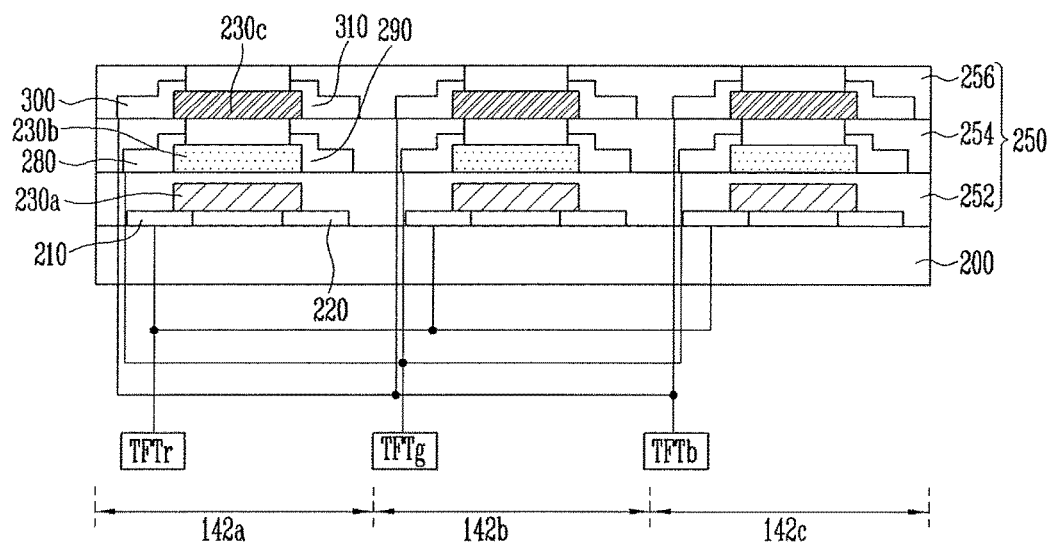
FIG. 16 illustrates a sectional view of one region of a light emitting device according to another embodiment.
Figure 17:
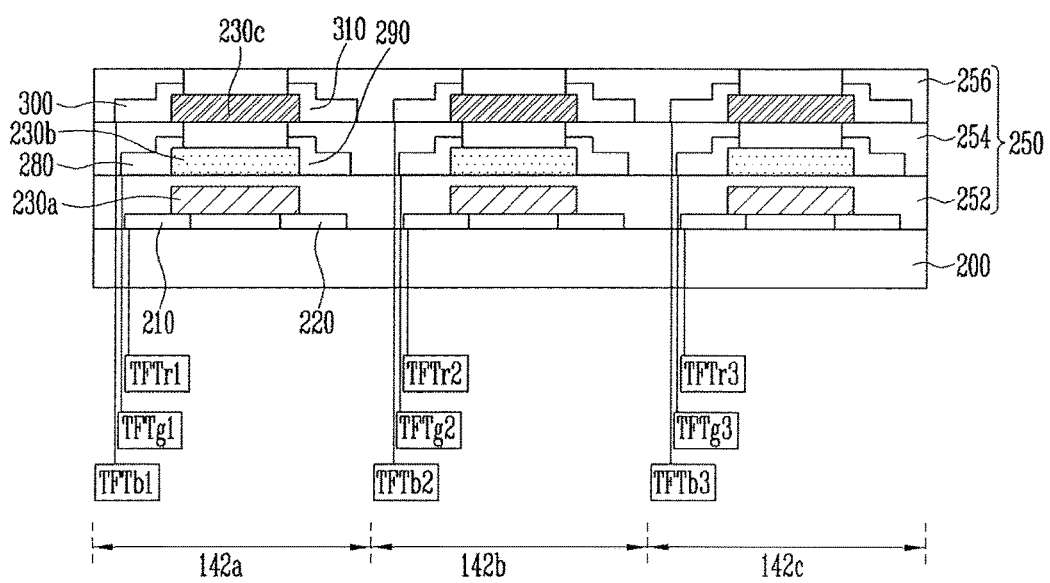
FIG. 17 illustrates a sectional view of one region of a light emitting device according to another embodiment.

FIGS. 16 and 17 are sectional views illustrating one region of light emitting devices according to other embodiments. Referring to FIG. 16, for at least each of first bar-type LEDs 230a, second bar-type LEDs 230b, and third bar-type LEDs 230c, the first bar-type LEDs 230a, the second bar-type LEDs 230b, and the third bar-type LEDs 230c may be electrically connected to driving elements TFTr, TFTg, and TFTb, respectively. According to this embodiment, for at least each of the first bar-type LEDs 230a, the second bar-type LEDs 230b, and the third bar-type LEDs 230c, the first bar-type LEDs 230a, the second bar-type LEDs 230b, and the third bar-type LEDs 230c may be independently driven.

Referring to FIG. 17, each of first bar-type LEDs 230a, second bar-type LEDs 230b, and third bar-type LEDs 230c may be electrically connected to individual driving elements TFTr1 to TFTr3, TFTg1 to TFTg3, and TFTb1 to TFTb3. According to this embodiment, each of the first bar-type LEDs 230a, the second bar-type LEDs 230b, and the third bar-type LEDs 230c may be independently driven.

According to one or more embodiments, a plurality of bar-type LEDs are disposed in different layers of each of a plurality of unit light emitting regions. Accordingly, a process for fabricating a light emitting device may be easily performed. In addition, at least one portion of one or more bar-type LEDs may serve as scattering particles. Accordingly, the light emission efficiency of the light emitting device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A light emitting device, comprising:
a plurality of unit light emitting regions on a substrate,
wherein at least one of the unit light emitting regions includes:
at least one pair of first and second electrodes that are spaced apart;
at least one first bar-type LED in a first layer on the substrate; and
at least one second bar-type LED in a second layer on the substrate, the second layer being on the first layer, wherein at least one of the first bar-type LED or the second bar-type LED is electrically connected between the first electrode and the second electrode.

2. The light emitting device as claimed in claim 1, wherein:
the first bar-type LED and the second bar-type LED emit light of different colors, and
one of the first and second bar-type LEDs having a longer wavelength than the other bar-type LED is disposed closer to the substrate.

3. The light emitting device as claimed in claim 1, wherein at least one end of at least one of the first bar-type LED or the second bar-type LED is an electrically floated end.

4. The light emitting device as claimed in claim 1, wherein the unit light emitting regions include:
a first unit light emitting region in which the first bar-type LED is electrically connected between the first electrode and the second electrode; and
a second unit light emitting region in which the second bar-type LED is electrically connected between the first electrode and the second electrode.

5. The light emitting device as claimed in claim 1, wherein at least one of the unit light emitting regions includes at least one third bar-type LED in a third layer on the substrate.

6. The light emitting device as claimed in claim 5, wherein the unit light emitting regions include:
a first unit light emitting region in which the first bar-type LED is electrically connected between the first electrode and the second electrode, the first unit light emitting region emitting light of a first color;
a second unit light emitting region in which the second bar-type LED is electrically connected between the first electrode and the second electrode, the second unit light emitting region emitting light of a second color; and
a third unit light emitting region in which the third bar-type LED is electrically connected between the first electrode and the second electrode, the third unit light emitting region emitting light of a third color.

7. The light emitting device as claimed in claim 5, wherein:
first ends of the first bar-type LED the second bar-type LED, and the third bar-type LED are commonly connected to the first electrode, and
second ends of the first bar-type LED, the second bar-type LED, and the third bar-type LED are commonly connected to the second electrode.

8. The light emitting device as claimed in claim 5, further comprising:
a first insulating layer between the first bar-type LED and the second bar-type LED;
a second insulating layer between the second bar-type LED and the third bar-type LED; and
a third insulating layer on the third bar-type LED.

9. The light emitting device as claimed in claim 8, wherein:
at least one of the first bar-type LED, the second bar-type LED, or the third bar-type LED is aligned such that a first end of at least one of the first bar-type LED, the second bar-type LED, or the third bar-type LED overlaps the first electrode and a second end of at least one of the first bar-type LED, the second bar-type LED, or the third bar-type LED overlaps the second electrode.

10. The light emitting device as claimed in claim 9, wherein at least one of the unit light emitting regions includes:
a first contact electrode penetrating the first insulating layer, the second insulating layer, and the third insulating layer, the first contact electrode electrically connecting, to the first electrode, one end of at least one of the first bar-type LED, the second bar-type LED, or the third bar-type LED; and
a second contact electrode penetrating the first insulating layer, the second insulating layer, and the third insulating layer, the second contact electrode electrically connecting, to the second electrode, the other end of at least one of the first bar-type LED, the second bar-type LED, or the third bar-type LED.

11. The light emitting device as claimed in claim 1, wherein:
the first electrode is electrically connected to a first end of the first bar-type LED, and the second electrode is electrically connected to a second end of the first bar-type LED, and
at least one of the unit light emitting regions includes a third electrode electrically connected to a first end of the second bar-type LED and a fourth electrode electrically connected to a second end of the second bar-type LED.

12. The light emitting device as claimed in claim 1, further comprising a first insulating layer interposed between the first bar-type LED and the second bar-type LED.

13. The light emitting device as claimed in claim 1, wherein the first layer and the second layer are sequentially stacked on a surface of the substrate.

14. A method for fabricating a light emitting device, the method comprising:
forming at least one pair of first and second electrodes in each of unit light emitting regions on a substrate;
forming at least one first bar-type LED in the unit light emitting regions;
forming a first insulating layer over the first bar-type LED;
forming at least one second bar-type LED on the first insulating layer;
forming a second insulating layer over the second bar-type LED; and
forming a first contact electrode such that the first electrode is electrically connected to a first end of at least one of the first bar-type LED and the second bar-type LED, and forming a second contact electrode such that the second electrode is electrically connected to a second end of the bar-type LED at least connected to the first contact electrode.

15. The method as claimed in claim 14, wherein:
the unit light emitting regions include a first unit light emitting region and a second unit light emitting region, and
the method includes:
after the first bar-type LED is formed, aligning the first bar-type LED between the first and second electrodes of the first unit light emitting region; and
after the second bar-type LED is formed, aligning the second bar-type LED between the first and second electrodes of the second unit light emitting region.

16. The method as claimed in claim 15, wherein
aligning the first bar-type LED includes applying a first voltage between the first and second electrodes of the first unit light emitting region, and aligning the second bar-type LED includes applying a second voltage greater than the first voltage between the first and second electrodes of the second unit light emitting region.

17. The method as claimed in claim 14, further comprising:
aligning at least one of the first or second bar-type LEDs such that ends of at least one of the first or second bar-type LEDs are on the first and second electrodes, respectively.

18. The method as claimed in claim 17, wherein forming the first and second contact electrodes includes:
forming a first contact hole penetrating the first and second insulating layers to expose a first end of at least one of the first or second bar-type LEDs and at least one region of the first electrode and a second contact hole penetrating the first and second insulating layers to expose a second end of at least one of the first or second bar-type LEDs and at least one region of the second electrode;
forming a first contact electrode to be buried in the first contact hole, and forming a second contact electrode to be buried in the second contact hole.

19. The method as claimed in claim 14, further comprising:
after the first bar-type LED is formed, aligning the first bar-type LED such that ends of the first bar-type LED are on the first and second electrodes, respectively; and
after the second bar-type LED is formed, aligning the second bar-type LED such that ends of the second bar-type LED are on the first and second electrodes, respectively.

20. The method as claimed in claim 19, wherein forming the first and second contact electrodes includes:
forming a first contact hole penetrating the first and second insulating layers to expose at least one region of the first electrode and first ends of the first and second bar-type LEDs and a second contact hole penetrating the first and second insulating layers to expose at least one region of the second electrode and second ends of the first and second bar-type LEDs; and
forming, in the first contact hole, the first contact electrode commonly connecting the first electrode to first ends of the first and second bar-type LEDs, and forming, in the second contact hole, the second contact electrode commonly connecting the second electrode to second ends of the first and second bar-type LEDs.

21. The method as claimed in claim 14, further comprising:
injecting at least one third bar-type LED onto the second insulating layer; and
forming a third insulating layer over the third bar-type LED.

22. The method as claimed in claim 14, further comprising:
after the first bar-type LED is formed, aligning the first bar-type LED to be electrically connected between the first and second electrodes, wherein forming the first and second contact electrodes includes:
forming a conductive layer on the second bar-type LED; and
patterning the conductive layer to form a third electrode connected to one end of the second bar-type LED and a fourth electrode connected to the other end of the second bar-type LED.

* * * * *